(12) United States Patent
Takada

(10) Patent No.: US 7,515,466 B2
(45) Date of Patent: Apr. 7, 2009

(54) METHOD FOR CONTROLLING SEMICONDUCTOR STORAGE DEVICE COMPRISING MEMORY CELLS EACH CONFIGURED TO HOLD MULTI-BIT DATA, AND MEMORY CARD PROVIDED WITH SEMICONDUCTOR STORAGE DEVICE

(75) Inventor: Tomoji Takada, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 11/691,799

(22) Filed: Mar. 27, 2007

(65) Prior Publication Data

US 2007/0245098 A1    Oct. 18, 2007

(30) Foreign Application Priority Data

Mar. 27, 2006    (JP)    ............................. 2006-086241

(51) Int. Cl.
*G11C 11/03*    (2006.01)
(52) U.S. Cl. ............................. 365/185.03; 365/185.22; 365/189.04; 365/230.08; 365/233.1
(58) Field of Classification Search ............ 365/185.03, 365/185.22, 189.04, 230.08, 233.1
See application file for complete search history.

(56) References Cited

U.S. PATENT DOCUMENTS 6,288,935 B1    9/2001    Shibata et al.
6,292,419 B2 *    9/2001    Tsuda ........................ 365/221
7,280,410 B2 *    10/2007    Janzen et al. .......... 365/189.18
2007/0245098 A1    10/2007    Takada

FOREIGN PATENT DOCUMENTS

JP    2001-93288    4/2001

OTHER PUBLICATIONS

U.S. Appl. No. 12/164,782, filed Jun. 30, 2008, Takada.

* cited by examiner

*Primary Examiner*—Pho M. Luu
(74) *Attorney, Agent, or Firm*—Oblon, Spivak, McClelland, Maier & Neustadt, P.C.

(57) ABSTRACT

A method for controlling a semiconductor storage device including memory cells each configured to hold data of 2 bits or more, the method includes starting first signal processing, and inputting lower bits into the semiconductor storage device in a ready state, writing the lower bits to the memory cells, changing the semiconductor storage device from the ready state into a busy state, changing the semiconductor storage device from the busy state into the ready state, and finishing the first signal processing, starting second signal processing, and inputting upper bits into the semiconductor storage device in the ready state, and writing the upper bits to the memory cells. A period for the writing the upper bits is longer than a period for the writing the lower bits. A period for performing the second signal processing is longer than a period for performing the first signal processing.

14 Claims, 21 Drawing Sheets

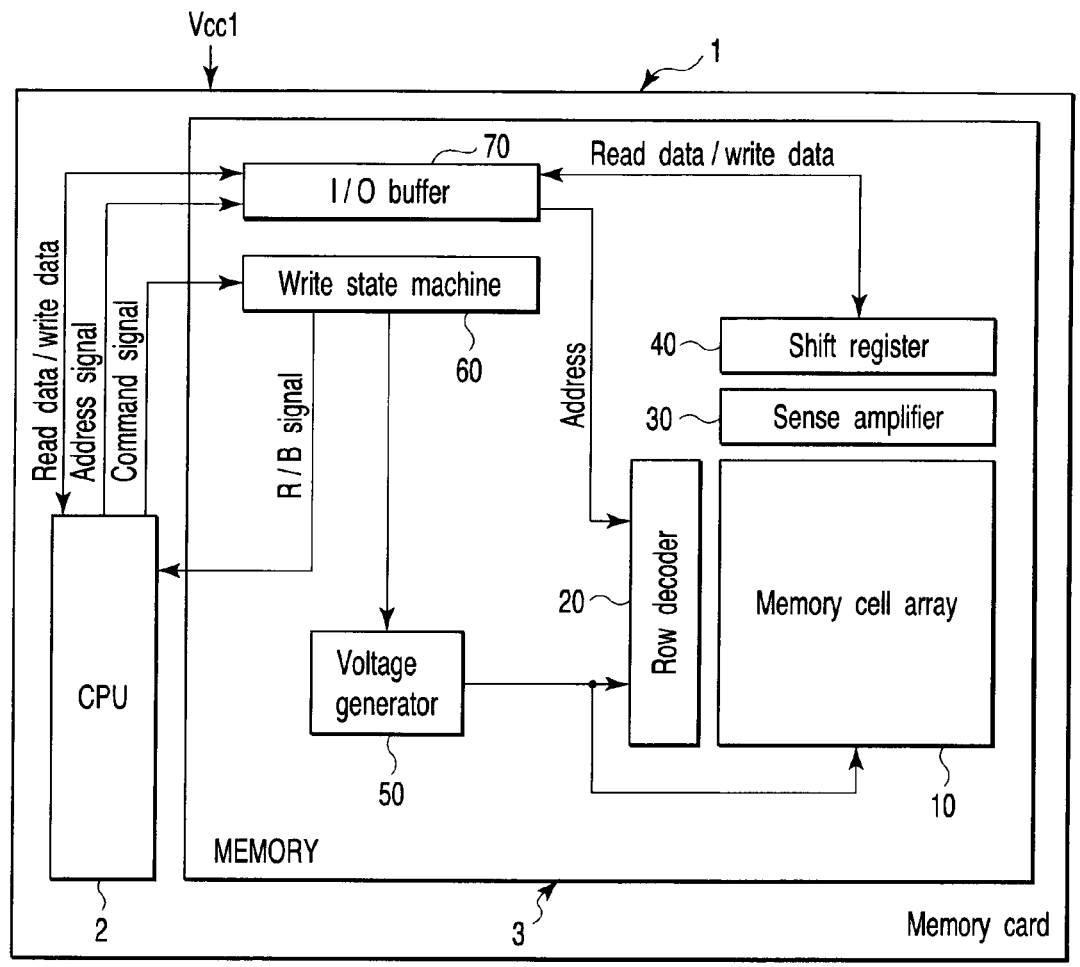
F I G. 1

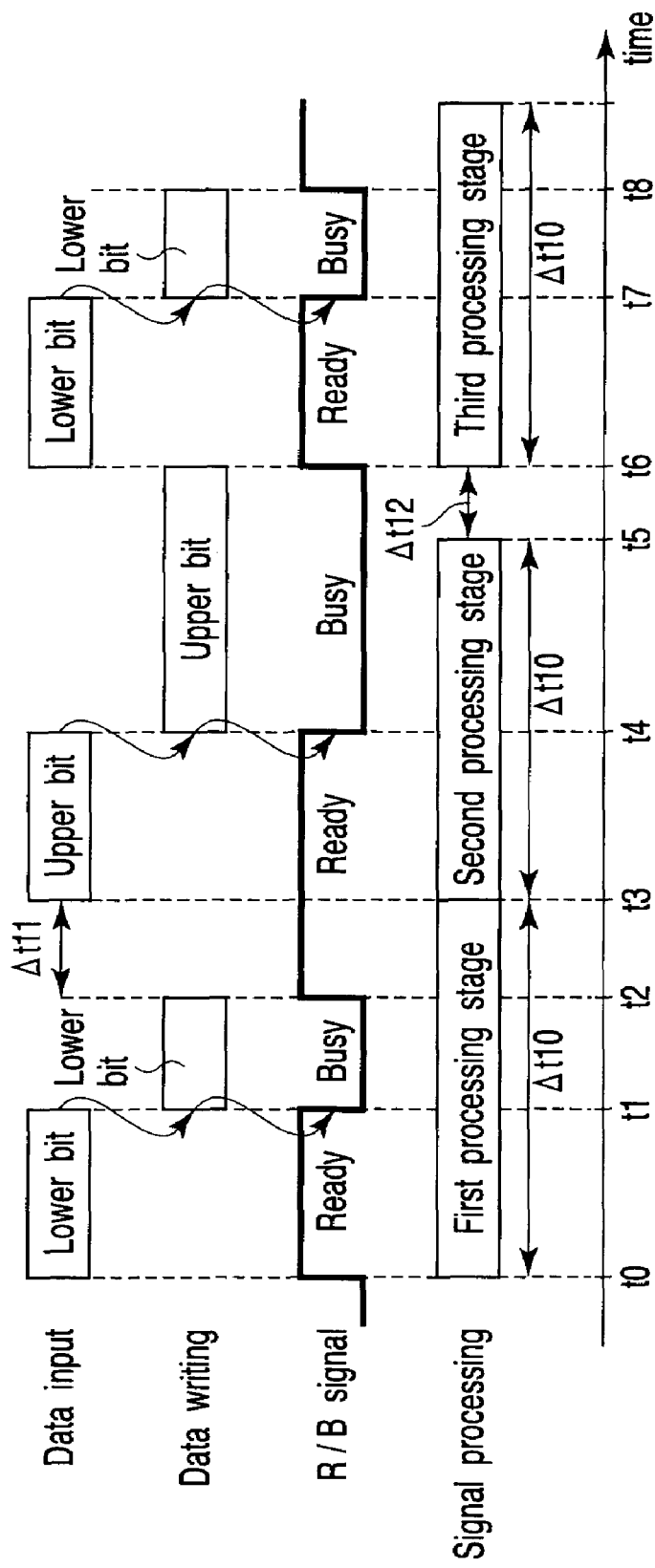
F I G. 9

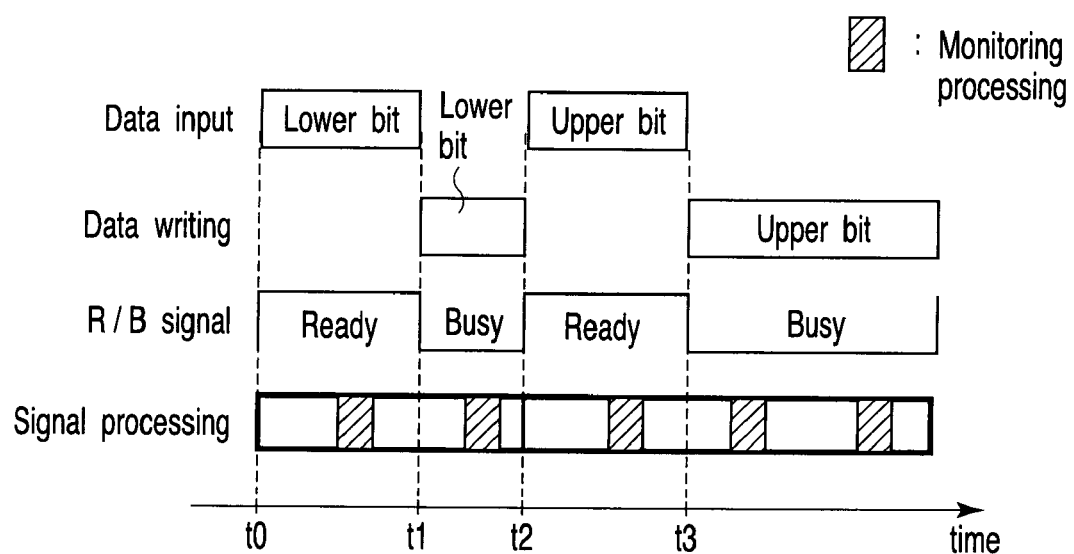
F I G. 15 ured to hold multi-bit data, and memory card provided with semiconductor storage device

CROSS-REFERENCE TO RELATED APPLICATIONS

This application is based upon and claims the benefit of priority from prior Japanese Patent Application No. 2006-086241, filed Mar. 27, 2006, the entire contents of which are incorporated herein by reference.

BACKGROUND OF THE INVENTION

1. Field of the Invention

The present invention relates to a method for controlling a semiconductor storage device, and also to a memory card. For example, the present invention relates to signal processing performed for read and write operations of a flash memory.

2. Description of the Related Art

Conventionally, there is known a NAND-type flash memory including memory cells each configured to hold 2-bit information, an example of which is disclosed in, e.g., Jpn. Pat. Appln. KOKAI Publication No. 2001-93288 (which will be referred to as a multi-level NAND-type flash memory, hereinafter). A write operation of data to a multi-level NAND-type flash memory is performed by first writing lower bits and then writing upper bits. At this time, in general, writing of the upper bits takes longer time than writing of the lower bits.

Further, in a system LSI or the like provided with a multi-level NAND-type flash memory, signal processing of various kinds is performed in conjunction with writing and reading of data relative to the multi-level NAND-type flash memory.

In general, according to the conventional method, the upper bit writing and the lower bit writing in a multi-level NAND-type flash memory are designed to use the same length of one cycle period for signal processing. However, the upper bits and lower bits require different time lengths for data writing. Accordingly, there is a problem in that the processing efficiency is decreased due to, e.g., the occurrence of a useless latency time for signal processing.

BRIEF SUMMARY OF THE INVENTION

A method for controlling a semiconductor storage device including a plurality of memory cells each configured to hold data of 2 bits or more, the method according to an aspect of the present invention includes:

setting the semiconductor storage device in a ready state to receive the data;

starting first signal processing by a control unit, and inputting lower bits of the data into the semiconductor storage device, in response to the semiconductor storage device having been set in the ready state;

writing the lower bits all together to the plurality memory cells;

changing the semiconductor storage device from the ready state into a busy state to reject input of the data, in response to a start of the writing the lower bits;

changing the semiconductor storage device from the busy state into the ready state, and finishing the first signal processing, at or by an end of the writing the lower bits;

starting second signal processing by the control unit, and inputting upper bits of the data into the semiconductor storage device, in response to the semiconductor storage device having been changed into the ready state;

writing the upper bits all together to the plurality memory cells; and finishing the second signal processing, at or by an end of the writing the upper bits, a period necessary for the writing the upper bits being longer than a period necessary for the writing the lower bits, a period necessary for performing the second signal processing being longer than a period necessary for performing the first signal processing.

A memory card according to an aspect of the present invention includes:

a semiconductor memory including a plurality of memory cells each configured to hold data of 2 bits or more, the semiconductor memory including an input/output buffer configured to receive write data in data writing and to receive addresses of memory cells in data reading, a memory cell array including the plurality of memory cells and arranged such that upper bits or lower bits of the 2-bit data are written or read all together in units of the plurality of memory cells, and a period necessary for writing the upper bits is longer than a period necessary for writing the lower bits, and a control circuit configured to control writing and reading of the data to and from the memory cell array, and to generate a ready/busy signal indicative whether or not the input/output buffer is in a state to receive the write data or the addresses; and a processor configured to output the write data and the addresses to the semiconductor memory, and to perform signal processing in synchronism with the ready/busy signal supplied from the control circuit, a period used for signal processing performed in synchronism with writing or reading the upper bits being longer than a period used for signal processing performed in synchronism with writing or reading the lower bits.

BRIEF DESCRIPTION OF THE SEVERAL VIEWS OF THE DRAWING

FIG. 1 is a block diagram showing a memory card according to a first embodiment of the present invention;

FIG. 9 is a timing chart showing data writing and signal processing in a memory card;

FIG. 15 is a timing chart showing data writing and signal processing in a memory card according to the third embodiment of the present invention, in terms of an example of monitoring processing;

DETAILED DESCRIPTION OF THE INVENTION

First Embodiment

A method for controlling a semiconductor storage device according to a first embodiment of the present invention will be explained with reference to FIG. 1. FIG. 1 is a block diagram showing a memory card according to this embodiment.

As shown in FIG. 1, the memory card 1 includes a CPU 2 and a multi-level NAND-type flash memory 3. The CPU 2 and flash memory 3 are formed of semiconductor chips independent of each other. These members may be hybridized in the same chip. In accordance with a request made by a host (not shown) (for example, a computer or the like), data is transferred between the host and flash memory 3 through the CPU 2. The CPU 2 is arranged to transfer data to and from the flash memory 3, and to perform signal processing based on data stored in the flash memory 3, as well as monitoring of the flash memory 3.

Figure 2:
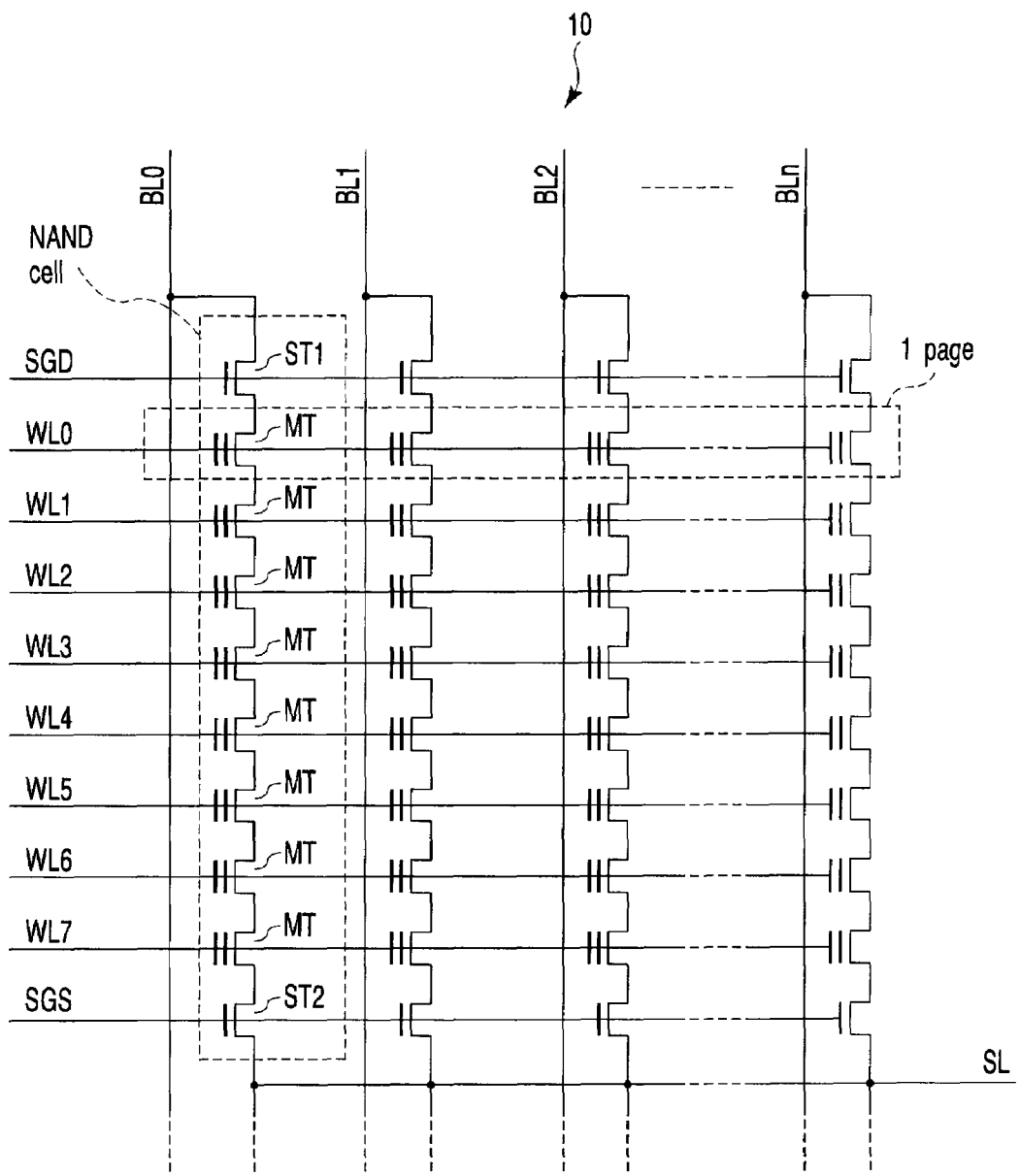
FIG. 2 is a circuit diagram showing a memory cell array disposed in a flash memory according to the first embodiment of the present invention.

The flash memory 3 includes a memory cell array 10, a row decoder 20, a sense amplifier 30, a shift register 40, a voltage generation circuit 50, a write state machine 60, and an I/O (input/output) buffer 70. The arrangement of the memory cell array 10 will be explained, with reference to FIG. 2. FIG. 2 is a circuit diagram showing a part of the memory cell array 10.

As shown in FIG. 2, the memory cell array 10 includes a plurality of NAND cells arrayed in a matrix format. FIG. 2 shows only NAND cells in one row. For the sake of simplicity of explanation, the following explanation will be given in relation to the NAND cells in one row. Each of the NAND cells includes eight memory cell transistors MT and selection transistors ST1 and ST2. The number of memory cell transistors MT is a mere example, and it may be 16, 32, 64, or 128. Each of the memory cell transistors MT has a multi-layered gate structure, which includes a charge storage layer (for example, floating gate) formed on a semiconductor substrate with a gate insulating film interposed therebetween, and a control gate formed on the charge storage layer with an inter-gate insulating film interposed therebetween. The memory cell transistors MT are arranged to use sources and drains in common between adjacent two of them. The electric current passages of the memory cell transistors MT are connected in series between the selection transistors ST1 and ST2. The drain region at one end of the memory cell transistors MT connected in series is connected to the source region of the selection transistor ST1. The source region at the other end of the memory cell transistors MT is connected to the drain region of the selection transistor ST2.

The control gates of the memory cell transistors MT in the same row are connected to word lines WL0 to WL7 in common for each of the groups. The gates of the selection transistors ST1 and ST2 of the memory cells in the same row are connected to selection gate lines SGD and SGS in common for each of the groups. Further, in the memory cell array, the drains of the selection transistors ST1 in the same column are connected to bit lines BL0 to BLn (n is a natural number) in common for each of the groups. The sources of the selection transistors ST2 are connected to a source line SL in common. The selection transistors ST1 and ST2 are not necessarily required to be disposed as a pair, and only one of them may be disposed as long as the corresponding NAND cell can be selected.

Figure 3:
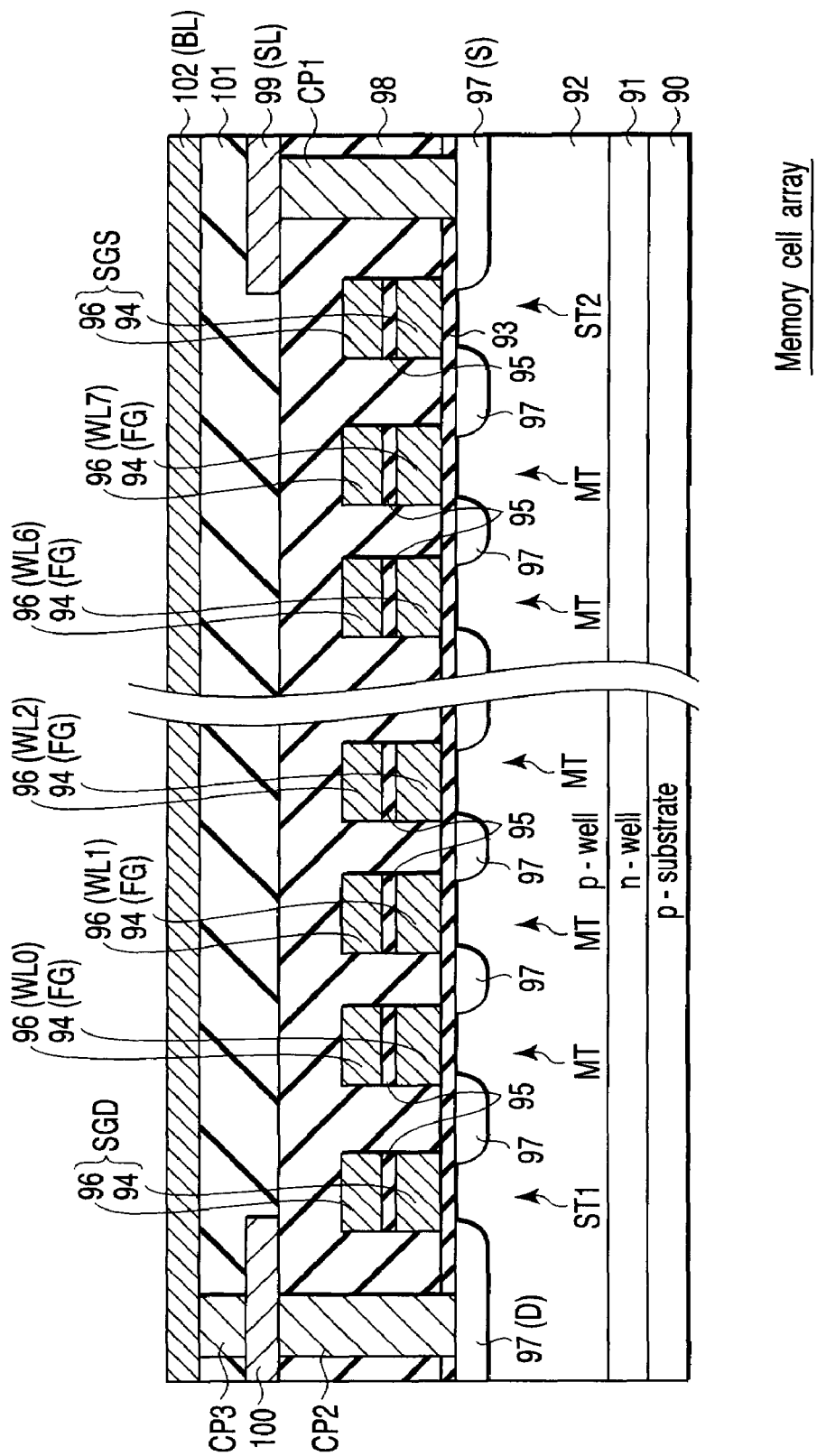
FIG. 3 is a sectional view showing a memory cell array disposed in a flash memory according to the first embodiment of the present invention.

Next, with reference to FIG. 3, an explanation will be given of the sectional structure of the NAND cell described above. FIG. 3 is a sectional view showing the NAND cell cut along a bit line direction. As shown in FIG. 3, an n-well region 91 is formed in a surface area of a p-semiconductor substrate 90. A p-well region 92 is formed in a surface area of the n-well region 91. A gate insulating film 93 is formed on the p-well region 92. The gate electrodes of the memory cell transistors MT and selection transistors ST1 and ST2 are formed on the gate insulating film 93. Each of the gate electrodes of the memory cell transistors MT and selection transistors ST1 and ST2 includes a poly-crystalline silicon layer 94, an inter-gate insulating film 95, and a poly-crystalline silicon layer 96 stacked in this order on the gate insulating film 93. The inter-gate insulating film 95 is formed of, e.g., a silicon oxide film, or an ON film, NO film, or ONO film having a multi-layered structure of silicon oxide and silicon nitride films.

In each of the memory cell transistors MT, the poly-crystalline silicon layer 94 serves as a charge storage layer (FG). On the other hand, the poly-crystalline silicon layer 96 is connected to the adjacent layer 96 or layers 96 in a direction perpendicular to the bit line. Thus, these layers 96 serve as a control gate (word line WL) in common. In each of the selection transistors ST1 and ST2, the poly-crystalline silicon layers 94 and 96 are respectively connected to the adjacent layer 94 or layers 94 and the adjacent layer 96 or layers 96 in the word line direction. Thus, layers 92 and 96 of the selection transistors ST1 serve as selection gate line SGD and layers 92 and 96 of the selection transistors ST2 serve as selection gate line SGS. Only the poly-crystalline silicon layers 94 may be used for a selection gate line. In this case, the poly-crystalline silicon layer 96 of each of the selection transistors ST1 and ST2 is set to have a constant electric potential or to be in a floating state. An $n^+$-impurity diffusion layer 97 is formed in the surface of the p-well region 92 between adjacent two of the gate electrodes. The impurity diffusion layer 97 is utilized by adjacent two of the transistors in common, and serves as a source (S) or drain (D).

An inter-level insulating film 98 is formed on the p-well region 92 to cover the memory cell transistors MT and selection transistors ST1 and ST2. A contact plug CP1 is formed in the inter-level insulating film 98 and reaches the impurity diffusion layer (source) 97 of the selection transistor ST2 on the source side. A metal interconnection layer 99 is formed on the inter-level insulating film 98 and is connected to the contact plug CP1. The metal interconnection layer 99 serves as a source line SL. A contact plug CP2 is formed in the inter-level insulating film 98 and reaches the impurity diffusion layer (drain) 97 of the selection transistor ST1 on the drain side. A metal interconnection layer 100 is formed on the inter-level insulating film 98 and is connected to the contact plug CP2.

An inter-level insulating film 101 is formed on the inter-level insulating film 98 to cover the metal interconnection layers 99 and 100. A contact plug CP3 is formed in the inter-level insulating film 101 and reaches the metal interconnection layer 100. A metal interconnection layer 102 is formed on the inter-level insulating film 101 and is connected to a plurality of contact plugs CP3 in common. The metal interconnection layer 102 serves as a bit line BL. Hereinafter, the memory cell transistor MT may be simply referred to as a memory cell.

Referring back to FIG. 1, an explanation of the arrangement of the flash memory 3 will be continued. In writing, the row decoder 20 selects one of the word lines WL0 to WL7 and the selection gate line SGD in accordance with a row address signal. Then, voltages are supplied to the selected word line and selection gate line SGD. In reading, the row decoder 20 selects one of word lines WL0 to WL7 and the selection gate lines SGS and SGD in accordance with a row address signal. Then, voltages are supplied to the selected word line and selection gate lines. In erasing, the row decoder 20 sets all the bit lines WL0 to WL7 at 0V, and applies a voltage to the semiconductor substrate (p-well region 92) on which the memory cells are formed.

The sense amplifier 30 amplifies data read out to the bit lines BL0 to BLn.

The shift register 40 holds a plurality of units of write data, and then writes the write data to the memory cells.

The voltage generation circuit 50 includes a positive charge pump circuit. The voltage generation circuit 50 generates positive voltages (for example, 20V, 7V, 5V, etc.) in accordance with a voltage Vcc1 given from the outside. The positive voltages generated by the voltage generation circuit 50 are supplied to the row decoder 20, memory cell array 10, and so forth.

The write state machine 60 controls the operation of the respective circuits included in the flash memory 3, in accordance with instruction signals given from the CPU 2. More specifically, the write state machine 60 performs timing control for writing, erasing, and reading data, and executes algorithm predetermined for the respective operations. Further, the write state machine 60 outputs a ready/busy signal (R/B signal) to the CPU 2. The ready/busy signal is a signal indicative whether the flash memory 3 is accessible or not; which will be described later in detail.

The I/O buffer 70 is used for transferring data to and from the CPU 2. For example, the I/O buffer 70 holds read data amplified by the sense amplifier 30, and outputs it to the CPU 2. Further, the I/O buffer 70 holds write data and address signals received from the CPU 2. Then, the I/O buffer 70 supplies the address signals to the row decoder 20, and supplies the write data to the shift register 40.

Figure 4:
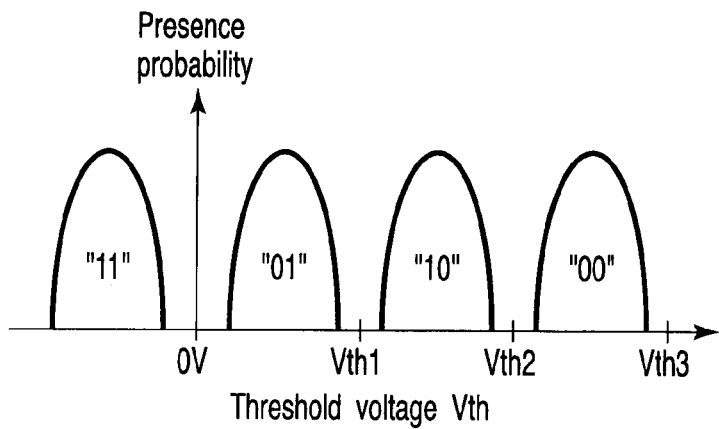
FIG. 4 is a graph showing a threshold value distribution in memory cells disposed in a flash memory according to the first embodiment of the present invention.

Next, a brief explanation will be given of an operation of the flash memory having the arrangement described above. The flash memory 3 can hold four different units of data in each of the memory cells. In other words, one memory cell can be used to hold 2-bit data. FIG. 4 is a graph showing a threshold value distribution in memory cells. In FIG. 4, the horizontal axis denotes threshold voltage Vth, and the vertical axis denotes presence probability of memory cells. As shown in FIG. 4, the memory cell can hold four units of data, "11", "01", "10", and "00", in increasing order of threshold voltage Vth. When the memory cell holds the "11" data, the threshold voltage Vth is set to satisfy Vth<0V. When the memory cell holds the "01" data, the threshold voltage Vth is set to satisfy 0V<Vth<Vth1. When the memory cell holds the "10" data, the threshold voltage Vth is set to satisfy Vth1<Vth<Vth2. When the memory cell holds the "00" data, the threshold voltage Vth is set to satisfy Vth2<Vth<Vth3.

<Write Operation>

Figure 5:
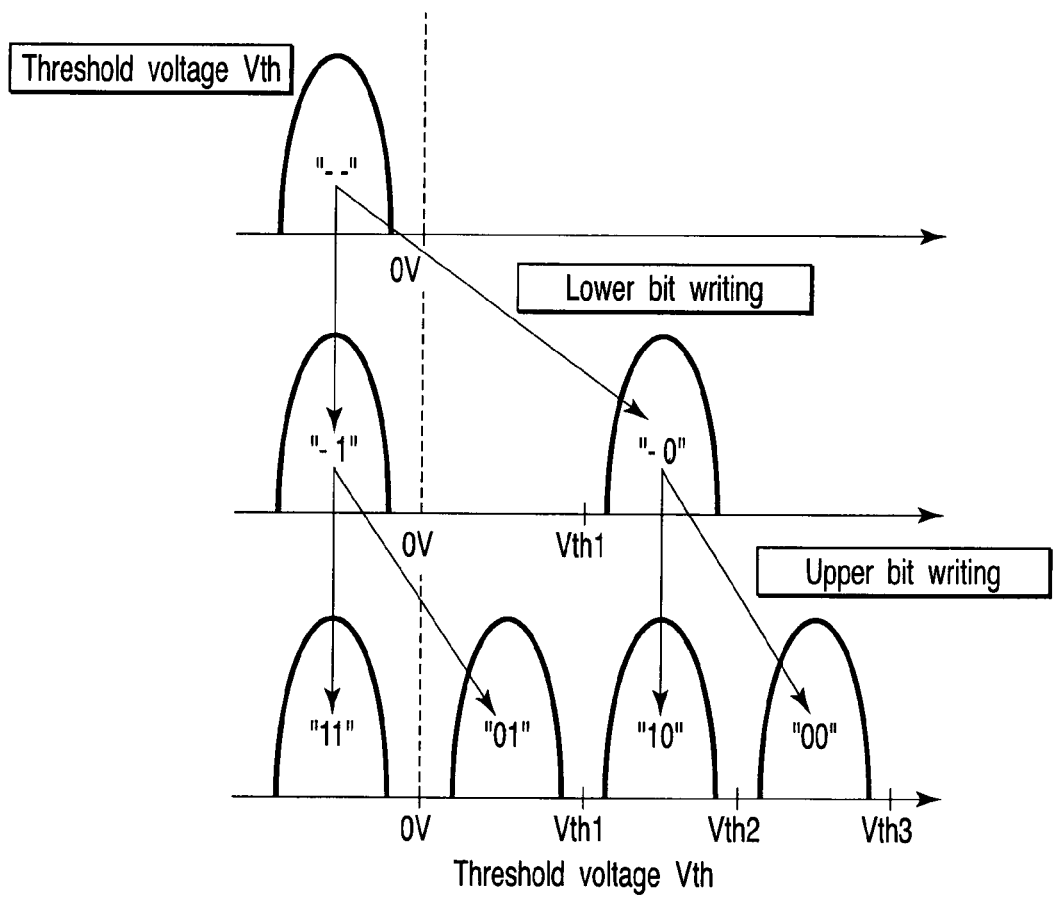
FIG. 5 is a graph showing a threshold value distribution in memory cells disposed in a flash memory according to the first embodiment of the present invention, in terms of a change in threshold value during data writing.

A data write operation will be explained with reference to FIGS. 1, 2, 4, and 5. FIG. 5 is a graph showing a threshold value distribution in memory cells, in terms of a change in the threshold value Vth of the memory cells during writing. Data is written all together to a plurality of memory cells connected in common to any one of the word lines (which will be referred to as one page).

In data writing, at first, positive voltages (20V, 7V) are generated by the voltage generation circuit 50 in accordance with an instruction from the write state machine 60. Further, address signals and write data are supplied from the CPU 2 to the I/O buffer 70. The address signals are transferred from the I/O buffer 70 to the row decoder 20, and the write data is transferred from the I/O buffer 70 to the shift register 40. For example, where data is written all together to the memory cells connected to 512 bit lines, 512 units of write data respectively corresponding to the memory cells are supplied to the shift register 40. The data writing is sequentially performed on the lower bit and upper bit of 2-bit data in this order. Hereinafter, the lower bits and upper bits of one page may be respectively referred to as a lower page and an upper page, and their specific units of data may be respectively referred to as lower page data and upper page data. Accordingly, data writing is first performed on the lower page as a batch, and is then performed on the upper page as a batch.

When write data is "0" data, the shift register 40 supplies a bit line with 0V. When write data is "1" data, the shift register 40 supplies a bit line with, e.g., 7V. The row decoder 20 selects one of the word lines WL0 to WL7, and supplies the selected word line with 20V, while it supplies the other non-selected word lines with, e.g., 7V. Further, the row decoder 20 supplies the selection gate line SGD with 5V, and supplies the selection gate line SGS with 0V.

As a result, in a memory cell supplied with the "0" data, the electric potential difference between the gate and channel is sufficiently large (20V), so electrons are injected into the charge storage layer by means of FN tunneling. Accordingly, the threshold value of the memory cell MC is changed in the increasing direction. On the other hand, in a memory cell supplied with the "1" data, the electric potential difference between the gate and channel is insufficiently large (20V–7V=13V), so electrons are not injected into the charge storage layer. Accordingly, the threshold value of the memory cell MC is maintained as it was.

By doing so, data is written all together to the memory cell transistors of one page.

In the multi-level NAND-type flash memory according to this embodiment, each of the memory cells can hold 2-bit data. The data writing of 2-bit data is sequentially performed such that the lower bit writing is first performed (which may be referred to as first writing), and the upper bit writing is then performed (which may be referred to as second writing). FIG. 5 shows this manner.

When the data writing starts, each of the memory cells are in the erased state. Specifically, the threshold voltage Vth of the memory cell takes on a negative value, which corresponds to a state where the memory cell holds the "11" data. In this state, data writing is first performed for the lower bit. Where the lower bit is set at "1", the threshold voltage Vth is not changed, because electrons are not injected into the charge storage layer. Where the lower bit is set at "0", electrons are injected into the charge storage layer. Consequently, the threshold voltage Vth is changed in the positive direction to essentially satisfy Vth1<Vth<Vth2. In other words, the memory cell has essentially the same threshold value as that obtained when it holds "10".

Then, writing is performed for the upper bit. At first, an explanation will be give of a case where the lower bit has been set at "1". Where the lower bit is set at "1" and the upper bit is set at "1", the threshold voltage Vth maintains a negative value, because electrons are not injected into the floating gate in the second writing. As a result, "11" is written to the memory cell. Where the upper bit is set at "0", electrons are injected into the floating gate in the second writing. As a result, the threshold voltage Vth is changed from a negative value in the positive direction to satisfy 0V<Vth<Vth1. Specifically, "01" is written to the memory cell.

Next, an explanation will be give of a case where the lower bit has been set at "0". Where the lower bit is set at "0" and the upper bit is set at "1", the threshold voltage Vth maintains a value obtained by the first writing, because electrons are not injected into the floating gate in the second writing. Specifically, as a result of Vth1<Vth<Vth2 being satisfied, "10" is written to the memory cell. Where the upper bit is set at "0", electrons are further injected into the floating gate in the second writing. As a result, the threshold voltage Vth is changed further in the positive direction to satisfy Vth2<Vth<Vth3. Specifically, "00" is written to the memory cell.

<Read Operation>

Next, a read operation will be explained with reference to FIGS. 1 and 4. In reading, a bit line is pre-charged to a predetermined voltage. Further, the row decoder 20 supplies the election gate lines SGD and SGS with, e.g., 5V, and sets the selection transistors ST1 and ST2 in the ON-state. Further, the non-selected word lines are supplied with e.g., 7V, while the selected word line is supplied with Vth1. This is the first reading to judge whether the lower bit of stored data is "1" or "0". If an electric current flows through the bit line, it means that the memory cell is set in the ON-state by Vth1, and thus the lower bit is found to be "1". In reverse, if no electric current flows, the lower bit is found to be "0".

Then, the second reading is performed. Where the lower bit has been judged to be "1" in the first reading, the voltage applied by the row decoder 20 to the selected word line is set at 0V. If an electric current flows through the bit line, it means that the threshold voltage Vth of the memory cell is negative, and thus the data is judged to be "11". If no electric current flows, it means that the threshold voltage Vth of the memory cell satisfies 0V<Vth<Vth1, and thus the data is judged to be "01".

Where the lower bit has been judged to be "0" in the first reading, the voltage applied by the row decoder 20 to the selected word line is set at Vth2. If an electric current flows through the bit line, it means that the threshold voltage Vth of the memory cell satisfies Vth1<Vth<Vth2, and thus the data is judged to be "10". In reverse, if no electric current flows, it means that the threshold voltage Vth of the memory cell satisfies Vth>Vth2, and thus the data is judged to be "00".

Also in this case, the data reading is performed for every page as a batch, such that the lower page reading is first performed, and the upper page reading is then performed. The sizes of pages may be set different between reading and writing.

<Erase Operation>

Next, a data erase operation will be explained. Data is erased all together from the memory cells that use the p-well region 92 in common. The erase operation is performed by extracting electrons from the floating gate by means of FN tunneling.

In erasing, the row decoder 20 supplies all the word lines with 0V, and supplies the p-well region 92 with e.g., 20V. As a result, electrons are extracted from the floating gate into the p-well region 92. Consequently, data of all the memory cells is erased, and the threshold voltage Vth of each of the memory cells takes on a negative value.

Figure 6:
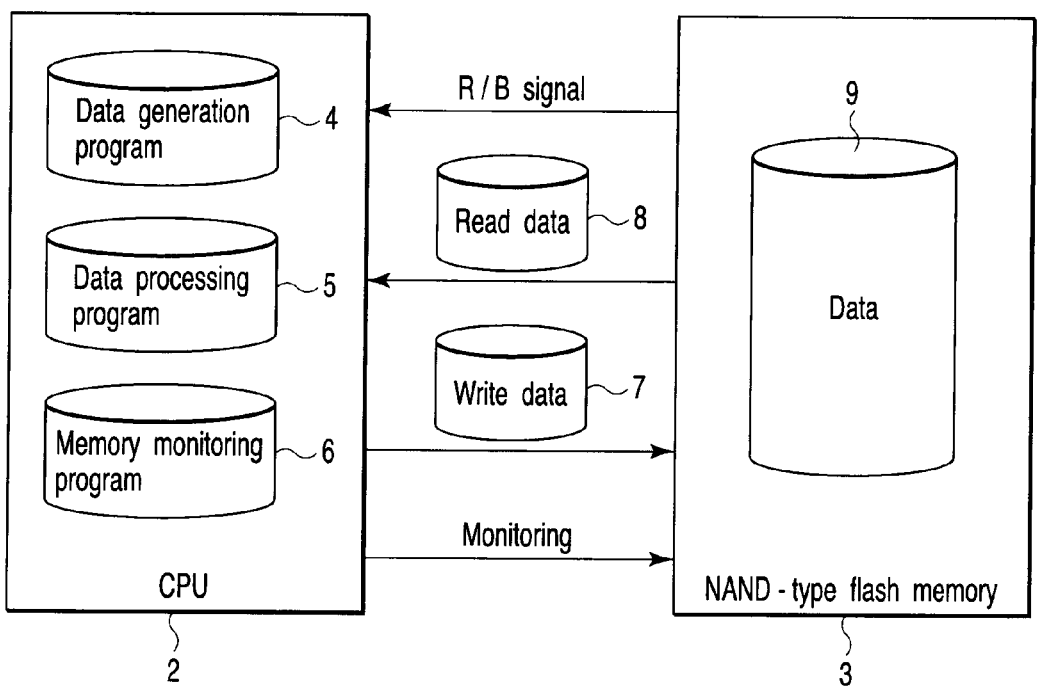
FIG. 6 is a block diagram showing a memory card according to the first embodiment of the present invention.
Figure 7:
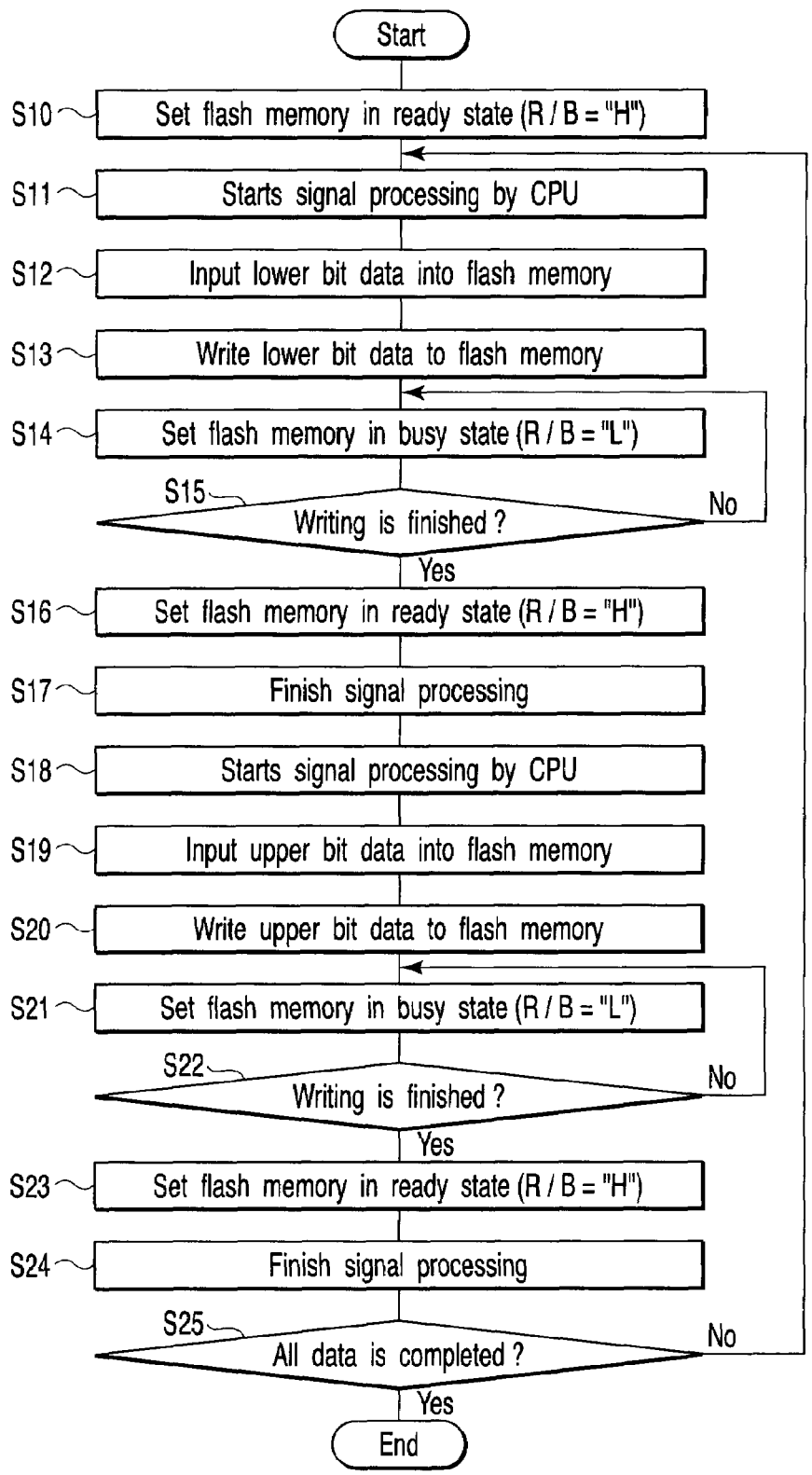
FIG. 7 is a flow chart showing data writing and signal processing in a memory card according to the first embodiment of the present invention.
Figure 8:
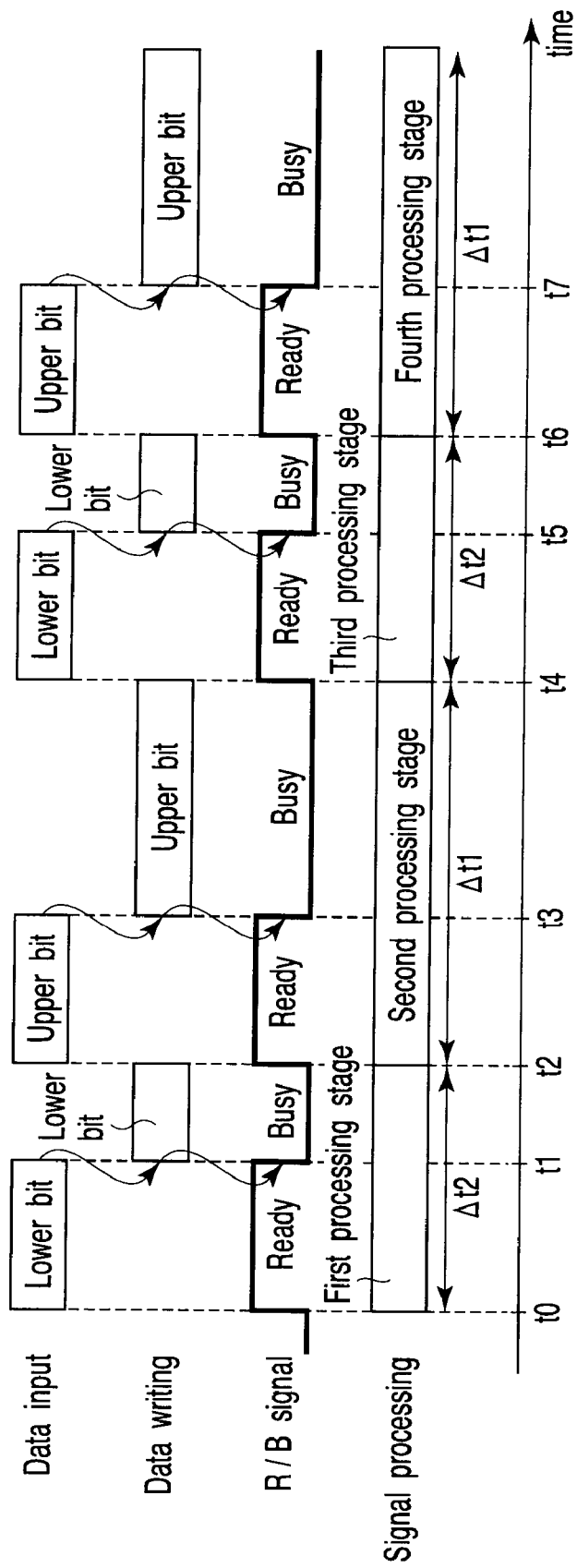
FIG. 8 is a timing chart showing data writing and signal processing in a memory card according to the first embodiment of the present invention.

Next, an explanation will be given of signal processing and its timing performed in the CPU 2, with reference to FIGS. 6 to 8. FIG. 6 is a block diagram showing the CPU 2 and flash memory 3, along with data and signals transferred between them. FIG. 7 is a flow chart showing a write operation and signal processing performed in the flash memory 3. FIG. 8 is a timing chart showing the write operation and signal processing.

As shown in FIG. 6, the CPU 2 includes a data generation program 4, a data processing program 5, and a memory monitoring program 6. The CPU 2 generates data 7 to be written to the flash memory 3 in accordance with the data generation program 4. Further, the CPU 2 processes data 8 read from the flash memory 3 in accordance with the data processing program 5. Furthermore, the CPU 2 monitors the state of the flash memory 3 in accordance with the memory monitoring program 6. The flash memory 3 holds data 9, and outputs the ready/busy signal described above to the CPU 2. The R/B signal is a signal arranged such that the "H" level thereof indicates that the flash memory 3 is accessible (Ready: ready state) and the "L" level thereof indicates that the flash memory 3 is inaccessible (Busy: busy state).

The CPU 2 performs the processing described above in accordance with write data or read data in the flash memory 3. The units of the processing are performed in synchronism with the R/B signal. These units of the processing will be collectively referred to as "signal processing". Next, an explanation will be given of write timing and signal processing timing with reference to FIGS. 7 and 8, in writing data to the flash memory 3, for example.

At first, the flash memory 3 is set in the ready state (Step S10 in FIG. 7, Time point t0 in FIG. 8), and the CPU 2 starts signal processing (Step S11: first processing stage). Further, the CPU 2 starts a data write operation, and inputs write data into the flash memory 3. As described previously, the lower bits of the data are first input into the flash memory 3 (Step S12, Time point t0 to Time point t1). At this time, the data thus input is data for one page to be written as a batch. The lower page data of one page is transferred to the shift register 40 of the flash memory 3, and is then written to memory cells by the shift register 40 (Step S13, Time point t1). While the data is being written to the memory cells, the flash memory 3 is set in the busy state, and the R/B signal is set at the "L" level (Step S14, Time point t1). The data writing to the memory cells is performed during a period of from Time point t1 to Time point t2. During this period, the flash memory 3 is kept in the busy state (Step S15: NO, and Step S14).

After the writing of the lower page data to the memory cells is finished (Step S15), the flash memory 3 is changed from the busy state to the ready state (Step S16, Time point t2). Further, the CPU 2 finishes the first processing stage (Step S17), and starts the subsequent signal processing (second processing stage) (Step S18). Accordingly, the CPU 2 inputs write data into the flash memory 3. The data thus input is formed of the upper bits of the 2-bit data (Step S19, Time point t2 to Time point t3). Also at this time, the data thus input is data for one page to be written as a batch. The upper page data of one page is transferred to the shift register 40 of the flash memory 3, and is then written to the memory cells by the shift register 40 (Step S20, Time point t3). While the data is being written to the memory cells, the flash memory 3 is set in the busy state, and the R/B signal is set at the "L" level (Step S21). The data writing to the memory cells is performed during a period of from Time point t3 to Time point t4. During this period, the flash memory 3 is kept in the busy state (Steps S22 and S21).

As described previously, a period Δt1 necessary for upper bit writing is longer than a period Δt2 necessary for lower bit writing. Accordingly, the period for performing the second signal processing stage is longer than the period for performing the first signal processing stage. In other words, the data amount processable in the second signal processing stage is larger than the data amount processable in the first signal processing stage. The CPU 2 receives the R/B signal from the write state machine 60, and starts the respective units of the signal processing in synchronism with the rising edges of the R/B signal.

After the writing of the upper page data to the memory cells is finished (Step S22), the flash memory 3 is changed from the busy state to the ready state (Step S23, Time point t4). Further, the CPU 2 finishes the second processing stage (Step S24). With the operations described above, the 2-bit data is written to the memory cells of one page as a batch. Further, where data is written on another page (Step S25), the flow returns to Step S1, and the same processing is repeated. Where data is not written (Step S26), the processing is finished.

FIG. 8 shows an example where data is further written on another page. While the lower page data is being written to the flash memory 3, the CPU 2 performs a third processing stage. Further, while the upper page data is being written, the CPU 2 performs a fourth processing stage. Also at this time, the period Δt1 for performing the fourth signal processing stage is longer than the period Δt2 for performing the third signal processing stage. In other words, the data amount processable in the fourth signal processing stage is larger than the data amount processable in the third signal processing stage.

As described above, with the method for controlling a semiconductor storage device according to this embodiment, the processing efficiency of a flash memory can be improved. Next, this effect will be explained in detail. FIG. 9 is a timing chart where the same processing as shown in FIG. 8 is performed by a conventional processing method. According to the conventional method, the upper bit writing and lower bit writing are designed to have the same length of one cycle for signal processing performed by a CPU. This length is defined by a period Δt10 in FIG. 9. Specifically, for example, this is a period longer than the period (Time point t0 to Time point t2) necessary for the lower bit data from the input thereof to the end of writing thereof, but shorter than the period (Time point t3 to Time point t6) necessary for the upper bit data from the input thereof to the end of writing thereof.

In this case, as shown in FIG. 9, although the input of the lower bit data starts at Time point t0 and the writing of the lower bit data ends at Time point t2, the first processing stage has not yet ended at Time point t2. Accordingly, even though the flash memory is set in the ready state at Time point t2, the input of the upper bit data to be subsequently written cannot start until Time point t3 at which the first processing stage ends.

Further, although the input of the upper bit data and the second processing stage start at Time point t3, and the second processing stage ends at Time point t5, the writing of the upper bit data has not yet ended at Time point t5. Accordingly, the subsequent third processing stage cannot start until Time point t6 at which the writing of the upper bit data ends.

As described above, according to the conventional method, a latency time is generated by a period Δt11 (Time point t2 to Time point t3) of from the end of lower bit writing to the end of signal processing in the CPU. Further, another latency time is generated by a period Δt12 (Time point t5 to Time point t6) of from the end of signal processing for upper bit writing to the end of upper bit writing.

If the length of one cycle for signal processing is designed to be the same as the period of from Time point t0 to Time point t2, the latency time Δt11 in lower bit writing becomes zero, but the latency time Δt12 in upper bit writing becomes longer. In reverse, if the length of one cycle for signal processing is designed to be the same as the period of from Time point t3 to Time point t6, the latency time Δt12 in upper bit writing becomes zero, but the latency time Δt11 in lower bit writing becomes longer.

However, according to this embodiment method, as explained with reference to FIG. 8, the signal processing period Δt1 for upper bit writing is designed to be longer than the signal processing period Δt2 for lower bit writing. In other words, this is an arrangement obtained by changing the conventional method shown in FIG. 9, such that the period Δt10 for the first processing stage is shortened, and the period Δt10 for the second processing stage is prolonged. Consequently, it is possible to shorten the latency time Δt11 following the lower bit writing, and the latency time Δt12 following the upper bit writing. Particularly, according to this embodiment, the timing of the signal processing end and the timing of the data writing end are preset to coincide with each other. Accordingly, the latency times Δt11 and Δt12 can be almost zero. As a result, the processing efficiency of a flash memory can be improved.

Second Embodiment

Figure 10:
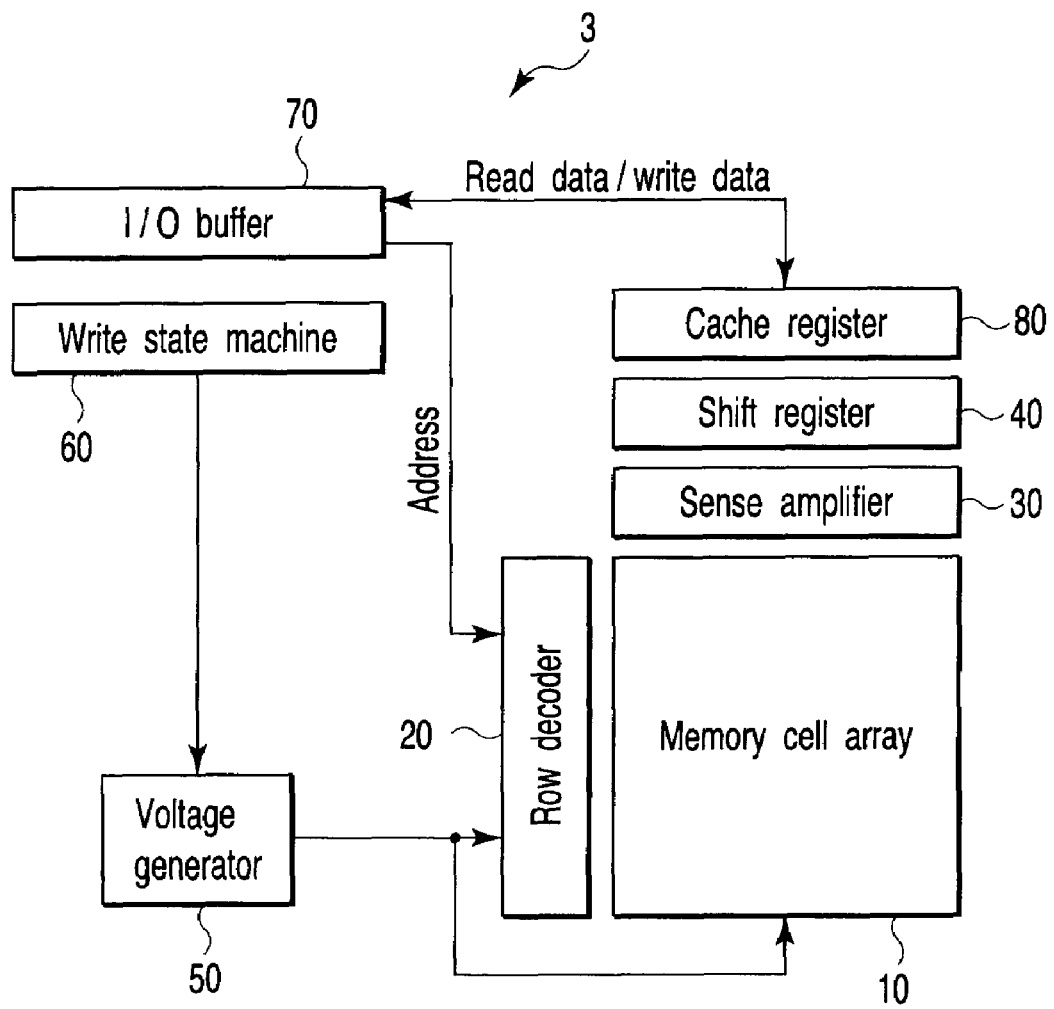
FIG. 10 is a block diagram showing a flash memory according to a second embodiment of the present invention.

Next, an explanation will be given of a method for controlling a semiconductor storage device according to the second embodiment of the present invention. This embodiment relates to a case where a flash memory 3 according to the first embodiment is provided with a cache register. FIG. 10 is a block diagram showing a flash memory 3 according to this embodiment.

As shown in FIG. 10, the flash memory 3 further includes a cache register 80 in the structure shown in FIG. 1 explained in the first embodiment. Write data supplied from the CPU 2 to the I/O buffer 70 is first input into the cache register 80. After write data for one page is input into the cache register 80, the data is supplied to the shift register 40. Accordingly, unlike the first embodiment, even during data writing, the flash memory 3 can be set in the ready state to receive subsequent data, as long as the cache register 80 is empty. The other structures are the same as those of the first embodiment, and thus an explanation thereof will be omitted.

Figure 11:
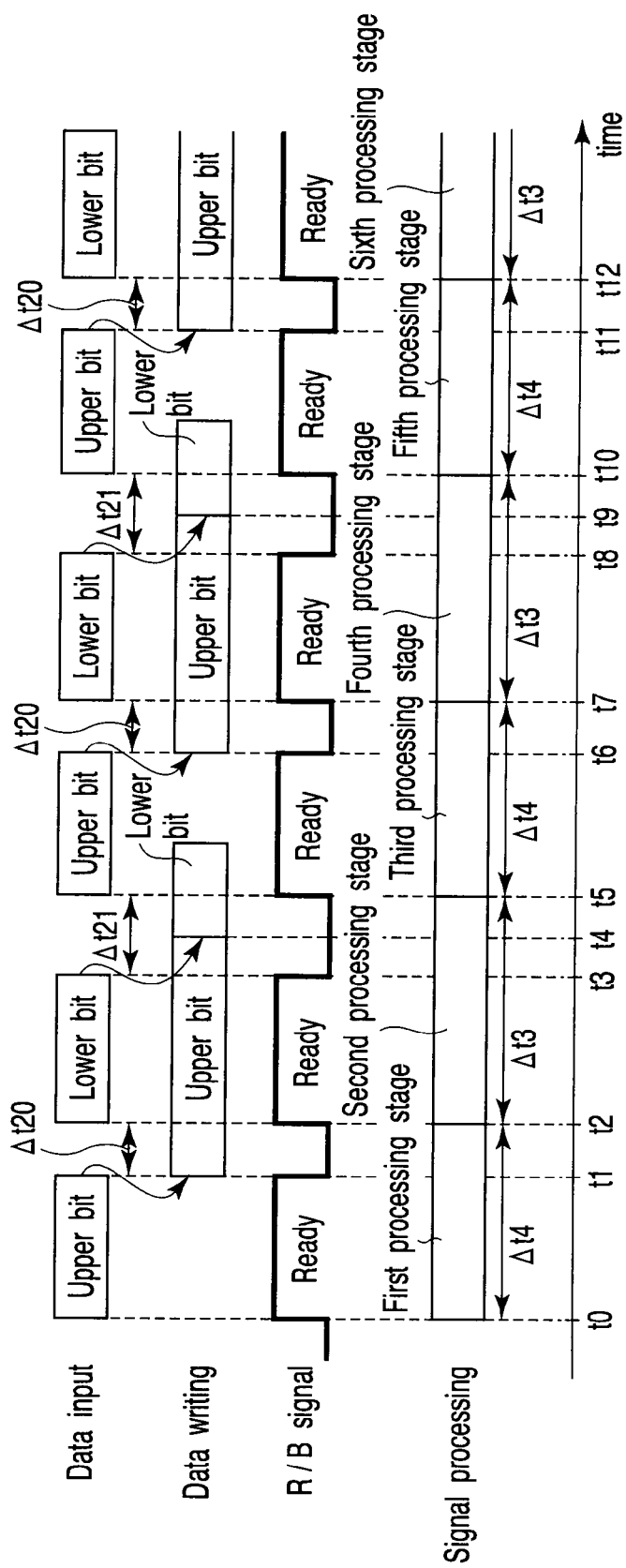
FIG. 11 is a timing chart showing data writing and signal processing in a memory card according to the second embodiment of the present invention.

Next, an explanation will be given of operation timing used for the flash memory according to this embodiment and signal processing timing performed by the CPU 2, with reference to FIG. 11. FIG. 11 is a timing chart showing a write operation and signal processing performed in the flash memory 3. The flow chart thereof is the same as that explained with reference to FIG. 7, except for a change in the input timing and write timing of lower bits.

At first, upper page data is input from the CPU 2 through the I/O buffer 70 into the cache register 80 at Time point t0. Then, the upper page data is transferred from the cache register 80 to the shift register 4. Then, the upper page data is written to the memory cells all together for every page at Time point t1. The flash memory 3 is set in the busy state (R/B signal="L") at Time point t1, but, when the cache register 80 is emptied (Time point t2), it is set in the ready state (R/B signal="H"), even during writing of the upper page data. Further, the CPU 2 performs the first processing stage during a period of from Time point t0 to Time point t2.

When the flash memory 3 is set in the ready state at Time point t2, lower page data is input form the CPU 2 into the flash memory 3. Further, the CPU 2 finishes the first processing stage and starts the second processing stage. During this time, writing of the upper page data to the memory cells is being performed. After the writing of the upper page data is finished at Time point t4, the lower page data input at Time point t2 is subsequently written to the memory cells (Time point t4 to t5).

When the flash memory 3 is set in the ready state at Time point t5, upper page data to be subsequently written is input from the CPU 2 into the flash memory 3. Further, the CPU 2 finishes the second processing stage and starts the third processing stage. During this time, writing of the lower page data to the memory cells is being performed. Then, the data is written in the same way as described above.

Also in the method according to this embodiment, a period $\Delta t3$ for signal processing of the CPU 2 (second, fourth, sixth, . . . , processing stage) in upper bit writing is longer than a period $\Delta t4$ for signal processing of the CPU 2 (first, third, fifth, . . . , processing stage) in lower bit writing.

As described above, also in the flash memory provided with the cache register, the same effects as in the first embodiment can be obtained. In the case of the flash memory provided with the cache register 80, when data transfer from the cache register 80 to the shift register 40 is completed and the cache register 80 is emptied, the flash memory is set in the ready state to receive data even during data writing. However, since the necessary periods of time differ from each other between the upper bit writing and lower bit writing, this difference causes the flash memory to be set in the busy state for different periods of time. Specifically, as shown in FIG. 11, a period ($\Delta t20$) of from the end of upper bit input to the start of lower bit reception differs from a period ($\Delta t21$) of from the end of lower bit input to the start of upper bit reception. Accordingly, if the lengths of the signal processing periods in the CPU 2 are designed to be the same as in the conventional technique, useless latency times are generated. However, according to this embodiment, as in the first embodiment, the signal processing period for upper bit writing is designed to be longer than the signal processing period for lower bit writing, so the processing efficiency of a flash memory can be improved.

Third Embodiment

Next, an explanation will be given of a method for controlling a semiconductor storage device according to the third embodiment of the present invention. This embodiment relates to a specific example of signal processing performed by the CPU 2 in the first and second embodiments. FIGS. 12 to 15 are timing charts each showing a write operation and signal processing performed in a flash memory 3, to which a method for controlling a semiconductor storage device according to the first embodiment is applied.

EXAMPLE OF ECC

Figure 12:
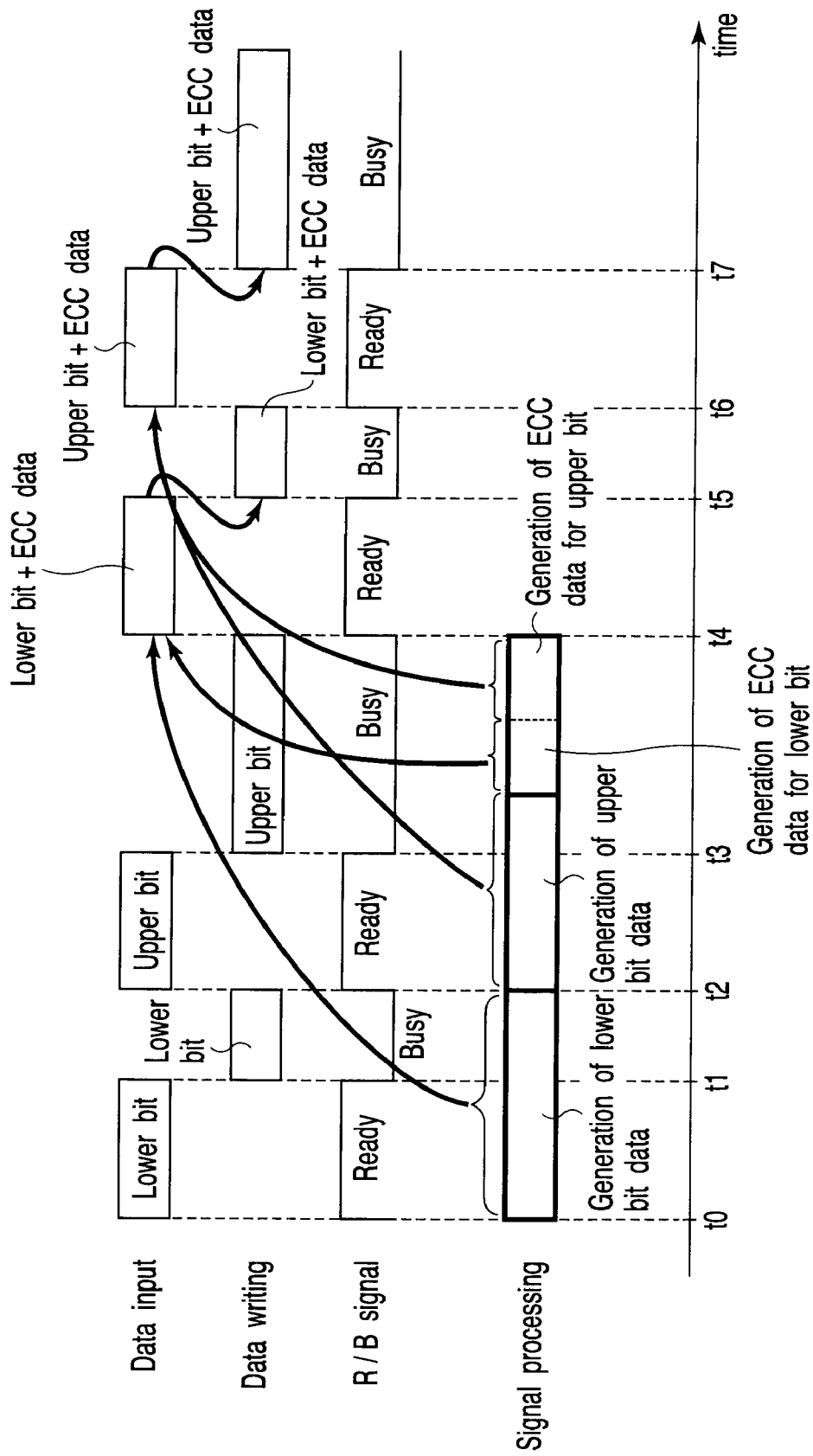
FIG. 12 is a timing chart showing data writing and signal processing in a memory card according to a third embodiment of the present invention, in terms of an example of ECC data generation.

FIG. 12 shows an example of ECC (Error Checking and Correcting). In this case, as shown in FIG. 12, the CPU 2 is arranged as follows. Specifically, lower page data, which is to be written to memory cells during a period of from Time point t0 to Time point t2 and a period of from Time point t4, is generated in accordance with a data generation program 4 (first processing stage). Further, upper page data, which is to be written to the memory cells during a period of from Time point t2 to Time point t4 and a period of from Time point t6, is generated in accordance with the data generation program 4 (second processing stage). During the second processing stage, in the CPU 2, ECC data are generated for the lower page data generated in the first processing stage, and ECC data are also generated for the upper page data generated in the second processing stage. When the lower page data is written (Time point t5), the ECC data for the lower page data is also written to the memory cells. Further, when the upper page data is written (Time point t7), the ECC data for the upper page data is also written to the memory cells.

<Audio Encoding Processing>

Figure 13:
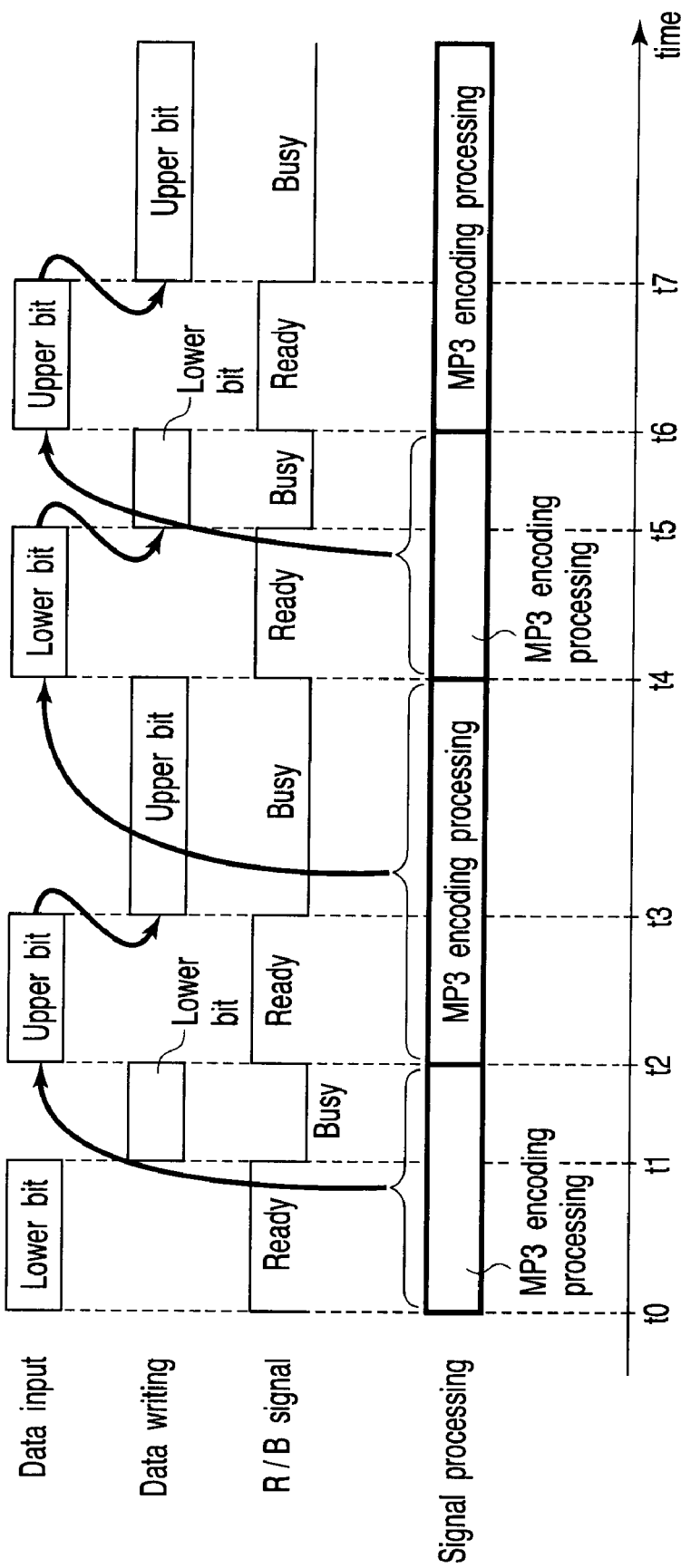
FIG. 13 is a timing chart showing data writing and signal processing in a memory card according to the third embodiment of the present invention, in terms of an example of audio data encoding.

FIG. 13 shows an example of audio encoding processing (MP3: MPEG-1 Audio Layer-III). In this case, as shown in FIG. 13, the CPU 2 is arranged as follows. Specifically, MP3 encoding processing is performed in accordance with a data generation program 4 during each of the processing stages. The audio data thus encoded is written to the flash memory 3. The type of encoding may be video processing, such as MPEG-2 or MPEG-4, in place of MP3.

<Batch Processing>

Figure 14:
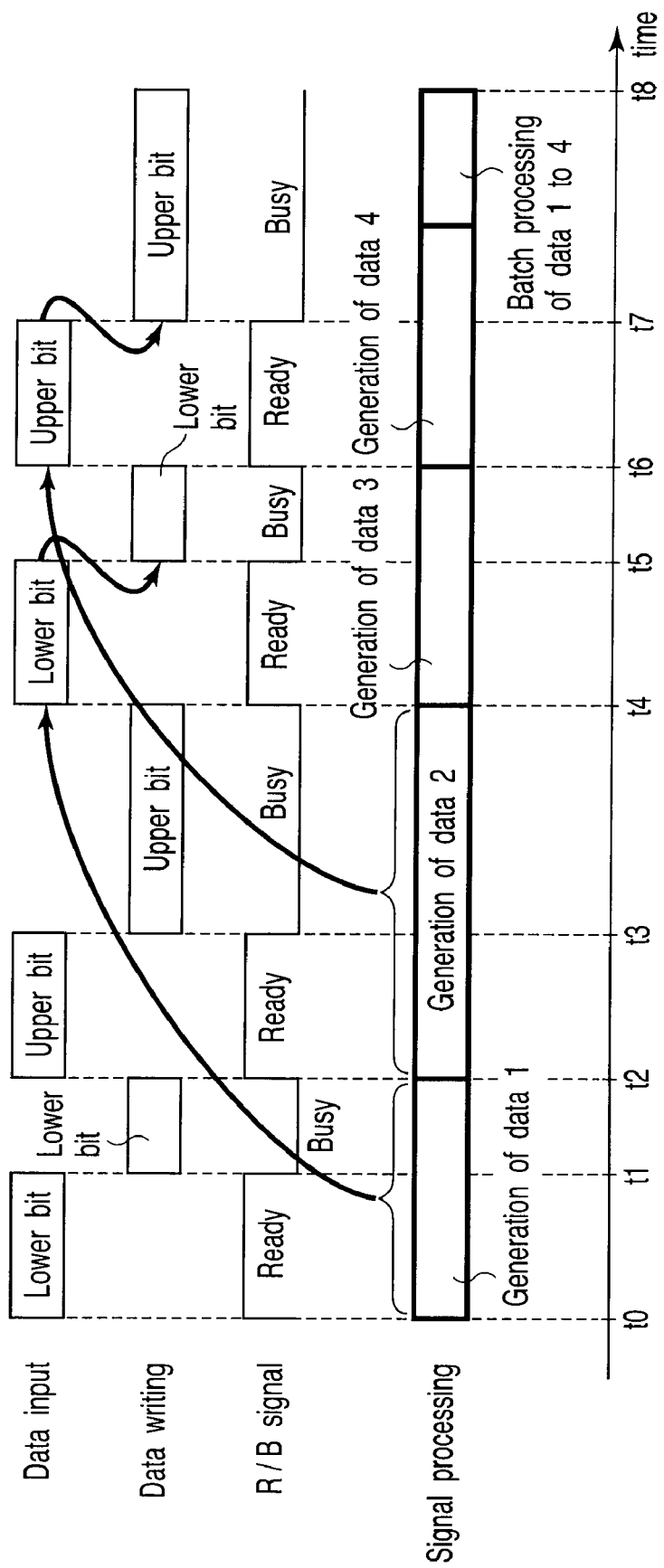
FIG. 14 is a timing chart showing data writing and signal processing in a memory card according to the third embodiment of the present invention, in terms of an example of batch processing for a plurality of units of data.

FIG. 14 shows an example of batch processing. There is a case where, after a plurality of data units are generated, another processing is performed on these data units all together. This example relates to such a case, wherein the CPU 2 is arranged as follows. Specifically, data 1 is generated (first processing stage) in accordance with a data generation program 4 during a period of from Time point t0 to Time point t2. Then, data 2 is generated (second processing stage) in accordance with the data generation program 4 during a period of from Time point t2 to Time point t4. Subsequently, data 3 is generated (third processing stage) in accordance with the data generation program 4 during a period of from Time point t4 to Time point t6. Then, data 4 is generated (fourth processing stage) in accordance with the data generation program 4 during a period of from Time point t6 to Time point t8. During the fourth processing stage, batch processing is also performed on data 1 to 4 generated in the first to fourth processing stages.

<Monitoring Processing>

FIG. 15 shows an example of monitoring processing. The CPU 2 may be arranged to monitor the state of the flash memory 3 at regular time intervals in accordance with a memory monitoring program 6.

In such methods, the CPU 2 can perform the processing described above in synchronism with the R/B signal.

Fourth Embodiment

Next, an explanation will be given of a method for controlling a semiconductor storage device according a fourth embodiment of the present invention. This embodiment relates to a case where a method according to the first embodiment is applied to a signal processing method in data reading. Since the structure of a memory card 1 used here is the same as that of the first embodiment, an explanation thereof will be omitted.

In this embodiment, an explanation will be given of reading timing and signal processing timing, used for reading data from the flash memory 3, with reference to FIGS. 16 and 17.

Figure 16:
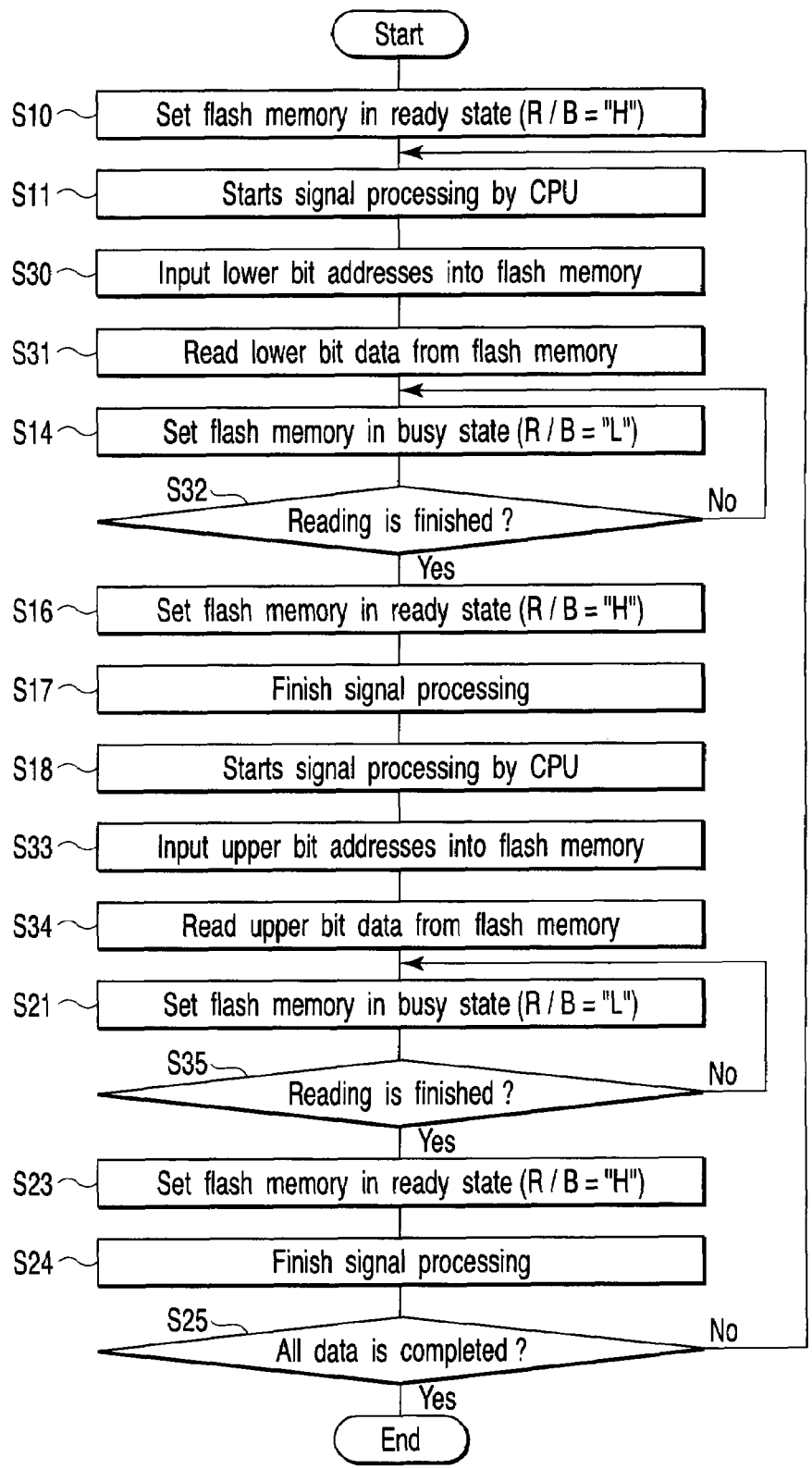
FIG. 16 is a flow chart showing data reading and signal processing in a memory card according to a fourth embodiment of the present invention.

FIG. 16 is a flow chart showing a read operation and signal processing performed in the flash memory 3, according to this embodiment. FIG. 17 is a timing chart showing the read operation and signal processing.

Figure 17:
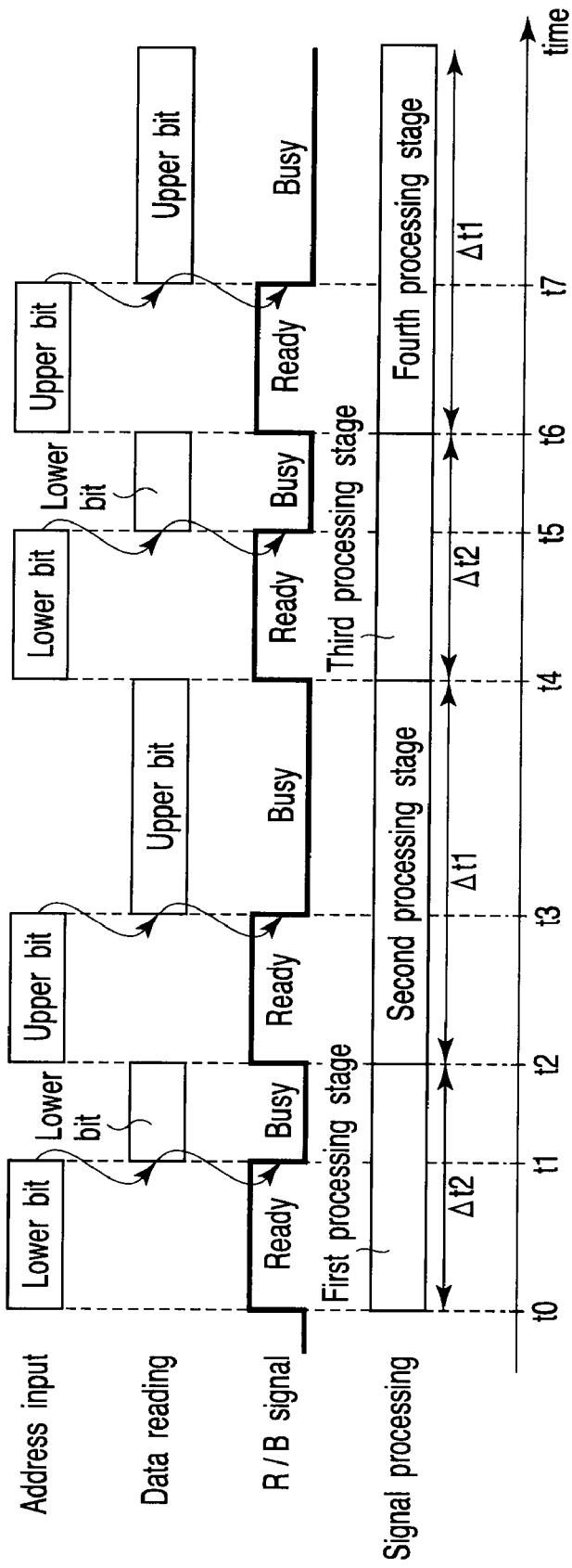
FIG. 17 is a timing chart showing data reading and signal processing in a memory card according to the fourth embodiment of the present invention.

As shown in FIGS. 16 and 17, the flash memory 3 is set in the ready state (Step S10 in FIG. 16, Time point t0 in FIG. 17), and the CPU 2 starts signal processing (Step S11: first processing stage). Further, the CPU 2 starts a data read operation, and inputs the addresses of memory cells to be read into the flash memory 3. At first, the CPU 2 inputs lower bit addresses (lower page addresses) to the flash memory 3 (Step S30, Time point t0 to Time point t1). Then, in accordance with the input addresses, one page data (lower page data) is read from the flash memory 3 (Step S31, Time point t1). While the data is being read from the memory cells, the flash memory 3 is set in the busy state, and the R/B signal is set at the "L" level (Step S14, Time point t1). The data reading from the memory cells is performed during a period of from Time point t1 to Time point t2. During this period, the flash memory 3 is kept in the busy state (NO in Step S32: Step S14).

After the reading of the lower page data from the memory cells is finished (Step S32: YES), the flash memory 3 is changed from the busy state to the ready state (Step S16, Time point t2). Further, the CPU 2 finishes the first processing stage (Step S17), and starts the subsequent signal processing (second processing stage) (Step S18). Accordingly, the CPU 2 inputs upper bit addresses (upper page addresses) to the flash memory 3 (Step S33, Time point t2 to Time point t3). Then, in accordance with the input addresses, one page data (upper page data) is read from the flash memory 3 (Step S34, Time point t3). While the data is being read from the memory cells, the flash memory 3 is set in the busy state, and the R/B signal is set at the "L" level (Step S21). The data reading from the memory cells is performed during a period of from Time point t3 to Time point t4. During this period, the flash memory 3 is kept in the busy state (Step S35: NO, and Step S21).

At this time, a period Δt1 necessary for upper page data reading is longer than a period Δt2 necessary for lower page data reading. Accordingly, the period for performing the second signal processing stage is longer than the period for performing the first signal processing stage. In other words, the data amount processable in the second signal processing stage is larger than the data amount processable in the first signal processing stage.

After the reading of the upper page data from the memory cells is finished (Step S35: YES), the flash memory 3 is changed from the busy state to the ready state (Step S23, Time point t4). Further, the CPU 2 finishes the second processing stage (Step S24). With the operations described above, the 2-page data is read from the flash memory 3. Further, where data is read from another page (Step S25), the flow returns to Step S11, and the same processing is repeated. Where data is not read (Step S26), the processing is finished.

FIG. 17 shows an example where data is further read from another page. While the lower page data is being read from the flash memory 3, the CPU 2 performs a third processing stage. Further, while the upper page data is being read, the CPU 2 performs a fourth processing stage. Also at this time, the period Δt1 for performing the fourth signal processing stage is longer than the period Δt2 for performing the third signal processing stage. In other words, the data amount processable in the fourth signal processing stage is larger than the data amount processable in the third signal processing stage.

As described above, with the method for controlling a semiconductor storage device according to this embodiment, the same effects as those of the first embodiment can be obtained in data reading.

It should be noted that, during the data read operation, the flash memory 3 is set in the busy state while data is being read from the memory cell array 10. Specifically, the data read operation is performed in line with the following sequence of periods (1) to (3) in a rough outline.

(1) Addresses are input from the CPU 2 into the I/O buffer 70, and then transferred from the I/O buffer 70 to the row decoder 20.

(2) In accordance with the input addresses, data is read from the memory cell array 10 into the sense amplifier. The data is amplified by the sense amplifier and is then temporarily held in the shift register 40.

(3) In response to access made by the CPU 2 (a read-enabling signal, which is one of the command signals, is input from the CPU 2 into the flash memory 3), the data held in the shift register 40 is output from the flash memory 3 through the I/O buffer 70.

In the sequence described above, the flash memory 3 is set in the busy state during the period (2), and is set in the ready state during the periods (1) and (3). In other words, according to this embodiment, the flash memory 3 is set in the busy state not over the whole period for reading data from the flash memory 3 to the CPU 2, but during a period for reading data from the memory cell array 10 into the shift register 40.

Fifth Embodiment

Next, an explanation will be given of a method for controlling a semiconductor storage device according to a fifth embodiment of the present invention. This embodiment is related to a case where a method according to the second embodiment is applied to a signal processing method in data reading. Since the structure of a memory card 1 used here is the same as that of the first or second embodiment except that the I/O buffer 70 includes a two-stage register, an explanation thereof will be omitted.

Figure 18:
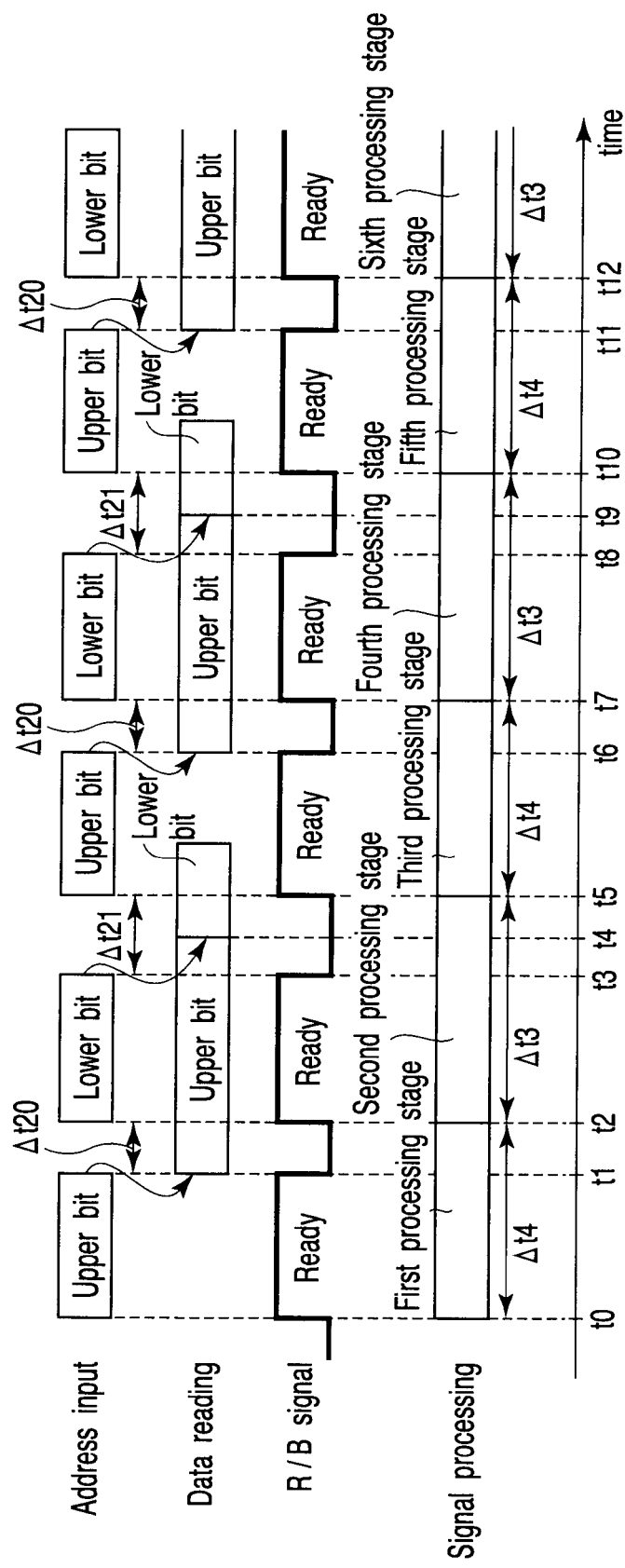
FIG. 18 is a timing chart showing data writing and signal processing in a memory card according to a fifth embodiment of the present invention.

In this embodiment, an explanation will be given of operation timing used for the flash memory according to this embodiment and signal processing timing performed by the CPU 2, with reference to FIG. 18. FIG. 18 is a timing chart showing a read operation and signal processing performed in the flash memory 3. The flow chart thereof is the same as that explained with reference to FIG. 16, except for a change in the address input timing and reading timing of lower bits.

At first, upper page addresses are input from the CPU 2 into the front buffer of the two-stage I/O buffer 70. Then, the upper page addresses are transferred to the rear buffer of the two-stage I/O buffer 70. Then, word lines are selected by the row decoder 20 in accordance with the addresses held in the rear buffer, so that the upper page data is read at Time point t1. The flash memory 3 is set in the busy state (R/B signal="L") at Time point t1, but, when the front buffer is emptied (Time point t2), it is set in the ready state (R/B signal="H"), even during reading of the upper page data. Further, the CPU 2 performs the first processing stage during a period of from Time point t0 to Time point t2.

When the flash memory 3 is set in the ready state at Time point t2, lower page addresses are input form the CPU 2 into the flash memory 3. Further, the CPU 2 finishes the first processing stage and starts the second processing stage. During this time, reading of the upper page data from the memory cells is being performed. After the reading of the upper page data is finished at Time point t4, the lower page addresses input at Time point t2 are subsequently transferred to the rear buffer, and the lower page data is read in accordance with the lower page addresses (Time point t4).

When the flash memory 3 is set in the ready state at Time point t5, upper page addresses for subsequent reading are input from the CPU 2 into the flash memory 3. Further, the CPU 2 finishes the second processing stage and starts the third processing stage. During this time, reading of the lower page data from the memory cells is being performed. Then, the data is read in the same way as described above.

Also in the method according to this embodiment, a period $\Delta t3$ for signal processing of the CPU 2 (second, fourth, sixth, . . . , processing stage) in upper page data reading is longer than a period $\Delta t4$ for signal processing of the CPU 2 (first, third, fifth, . . . , processing stage) in lower page data reading.

As described above, with the method for controlling a semiconductor storage device according to this embodiment, the same effects as those of the second embodiment can be obtained in data reading. The signal processing described above with reference to the third embodiment may be a specific example used for the fourth and fifth embodiments.

As described above, according to the first to fifth embodiments of the present invention, a system including a multi-level NAND-type flash memory and a CPU for controlling the memory is arranged, as follows. Specifically, a signal processing time corresponding to the upper page writing, which requires a longer writing time, is designed to be longer than a signal processing time corresponding to the lower page writing. In other words, data processing amount is preset to be larger in the upper page writing. As a result, it is possible to shorten the latency time of data input following the lower bit writing, and the latency time following signal processing corresponding to the upper page, thereby improving the operation efficiency of the flash memory.

Figure 19:
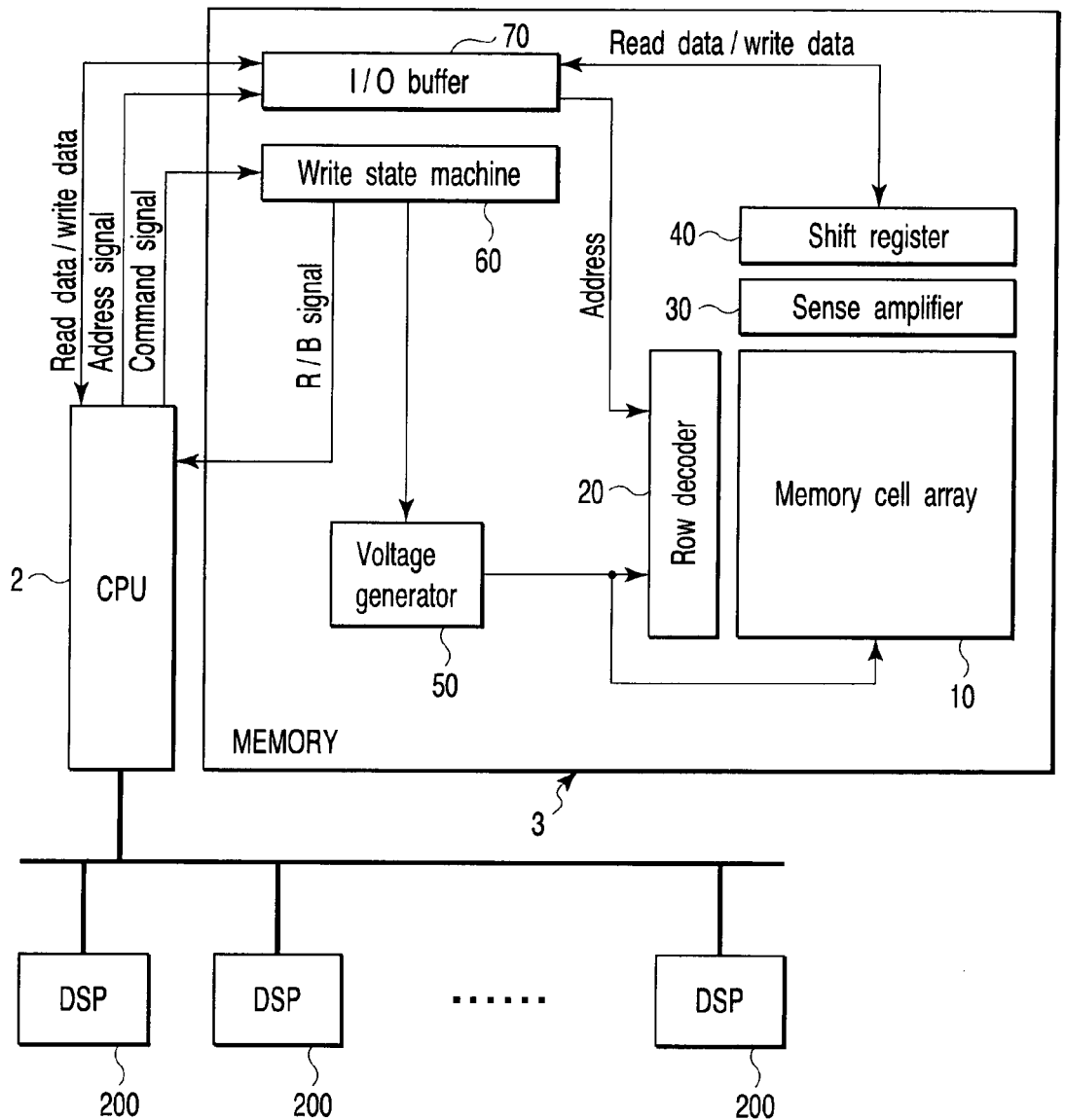
FIG. 19 is a block diagram showing a memory system according to a second modification of the first to fifth embodiments of the present invention.

The embodiments described above are exemplified by a case where the CPU 2 is arranged to perform signal processing in synchronism with the R/B signal. However, signal processing may be performed by another circuit block. FIG. 19 is a block diagram showing a memory system. As shown in FIG. 19, this memory system includes a plurality of DSPs (Digital Signal Processor) 200 in addition to the structure described with reference to FIG. 1. The DSPs 200 perform signal transfer to and from the CPU 2 through a bus. Signal processing of various kinds is performed in synchronism with the R/B signal supplied from the NAND-type flash memory 3 or a signal set in synchronism with the R/B signal.

Figure 20:
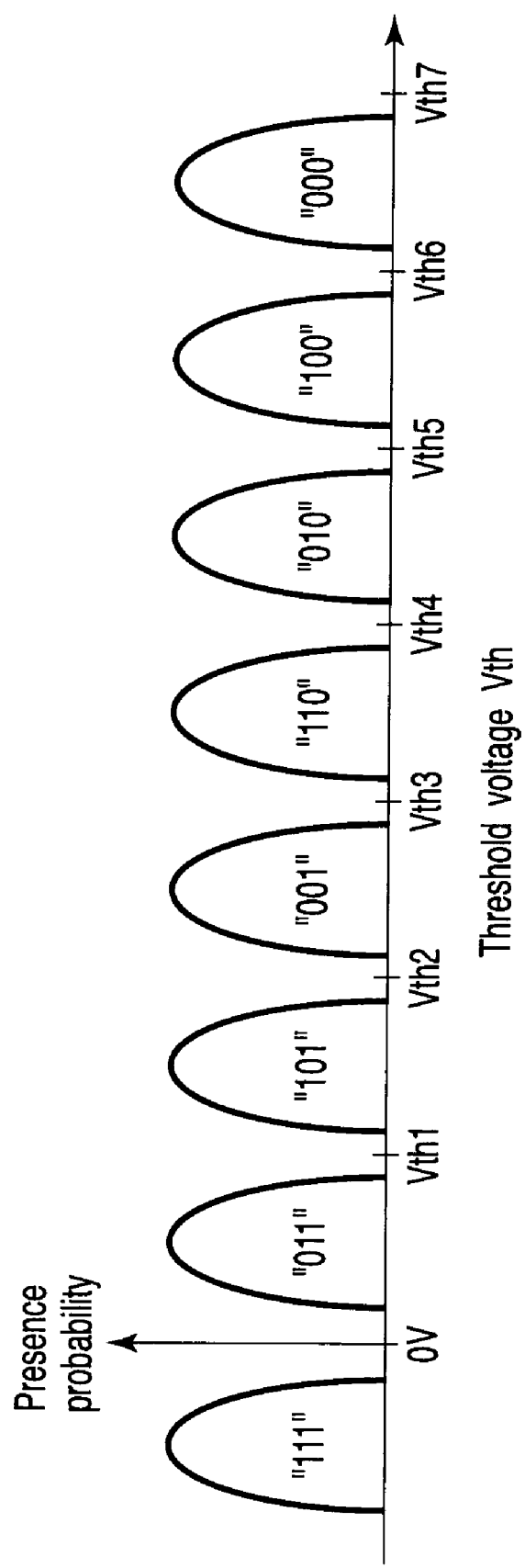
FIG. 20 is a graph showing a threshold value distribution in memory cells disposed in a flash memory according to the second modification of the first to fifth embodiments of the present invention.

Further, the embodiments described above are exemplified by a case where each of the memory cells can hold 2-bit data. However, the memory cells may be configured to hold data of 3 bits or more. FIG. 20 is a graph showing a threshold value distribution in memory cells configured to hold 3-bit data. As shown in FIG. 20, the memory cell can hold 8 values of from "000" to "111". Also in case where each of the memory cells is configured to hold data of 3 bits or more, signal processing time periods can be determined in accordance with the writing time periods and reading time periods of the respective bits.

Further, the embodiments described above are exemplified by a case where the start and end timing of signal processing completely coincides with the rising edge and falling edge of the R/B signal. However, they do not necessarily need to coincide with each other, but can accept a time difference. Further, some examples of signal processing are described in the third embodiment, but they are not limiting. Other signal processing is encompassed as long as it is performed for a flash memory 3 in synchronism with an R/B signal. Signal processing may be performed in units of pages or in units of a plurality of pages. In general, processing for audio data and video data corresponds to the latter case. Further, signal processing may be data format conversion processing, such as processing for converting data to an interface protocol for every medium. In this case, for example, a controller included in a memory card or USB memory corresponds to the CPU 2 used in the embodiments described above. Further, the embodiments described above are applicable to another semiconductor memory other than a NAND-type flash memory, as long as the memory satisfies the following conditions. Specifically, each of the memory cells thereof can hold a plurality of bits, for each of which writing or reading is performed, and there is a time difference in the writing or reading, depending on the bits.

Further, the first to fifth embodiments can be utilized in various applications. Next, brief explanations will be given of specific examples of the CPU 2 and flash memory 3.

[Memory Card]

Figure 21:
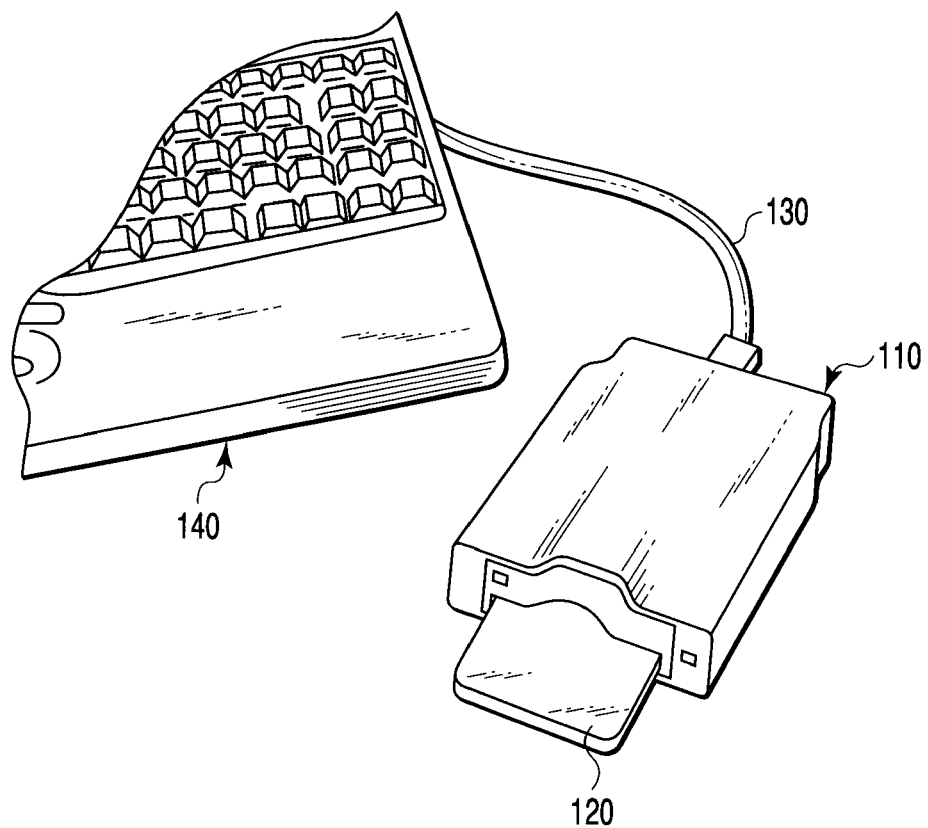
FIG. 21 is an external view showing a memory card provided with a flash memory according to any one of the first to fifth embodiments of the present invention, along with a connector device and a personal computer.

FIG. 21 is an external view showing a personal computer, a memory card, and a memory card reader/writer. As shown in FIG. 21, the memory card 120 is inserted into the reader/writer 110. The reader/writer 110 is connected to the personal computer 140 through a connection cable 130. The memory card 120 contains a NAND-type flash memory 3 described with reference to the embodiments. The personal computer 140 serves as a CPU 2, as described above with reference to the embodiments, to perform data reading and writing on the memory card 120 by use of the reader/writer 110. As shown in this example, the memory card may be provided only with flash memory 3 without the CPU.

[USB Memory]

The CPU 2 and flash memory 3 may be built in, e.g., a USB memory. The USB memory contains a CPU 2 and a NAND-type flash memory 3 described with reference to the embodiments, and is configured to be connected to a personal computer through a USB terminal.

[Portable Music Player]

The CPU 2 and flash memory 3 may be respectively built in, e.g., a personal computer and a portable music player. The portable music player contains a NAND-type flash memory 3 described with reference to the embodiments, and is configured to store music data. The portable music player is connected to a personal computer through a connection cable.

The personal computer serves as a CPU 2, as described above with reference to the embodiments, to write encoded music data to the portable music player.

The portable music player may be provided with a function built therein to serve as a CPU 2. In this case, e.g., the function built in the portable music player can perform encoding processing of music data.

[IC Card]

Figure 22:
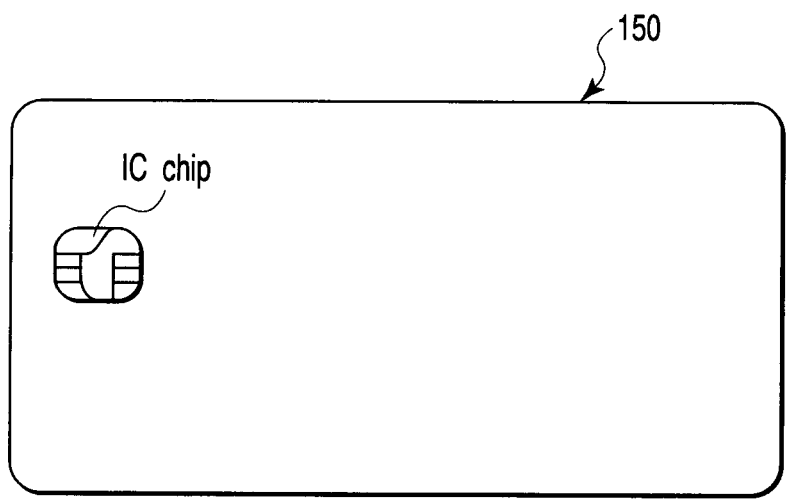
FIG. 22 is an external view showing an IC card provided with a flash memory according to any one of the first to fifth embodiments of the present invention.
Figure 23:
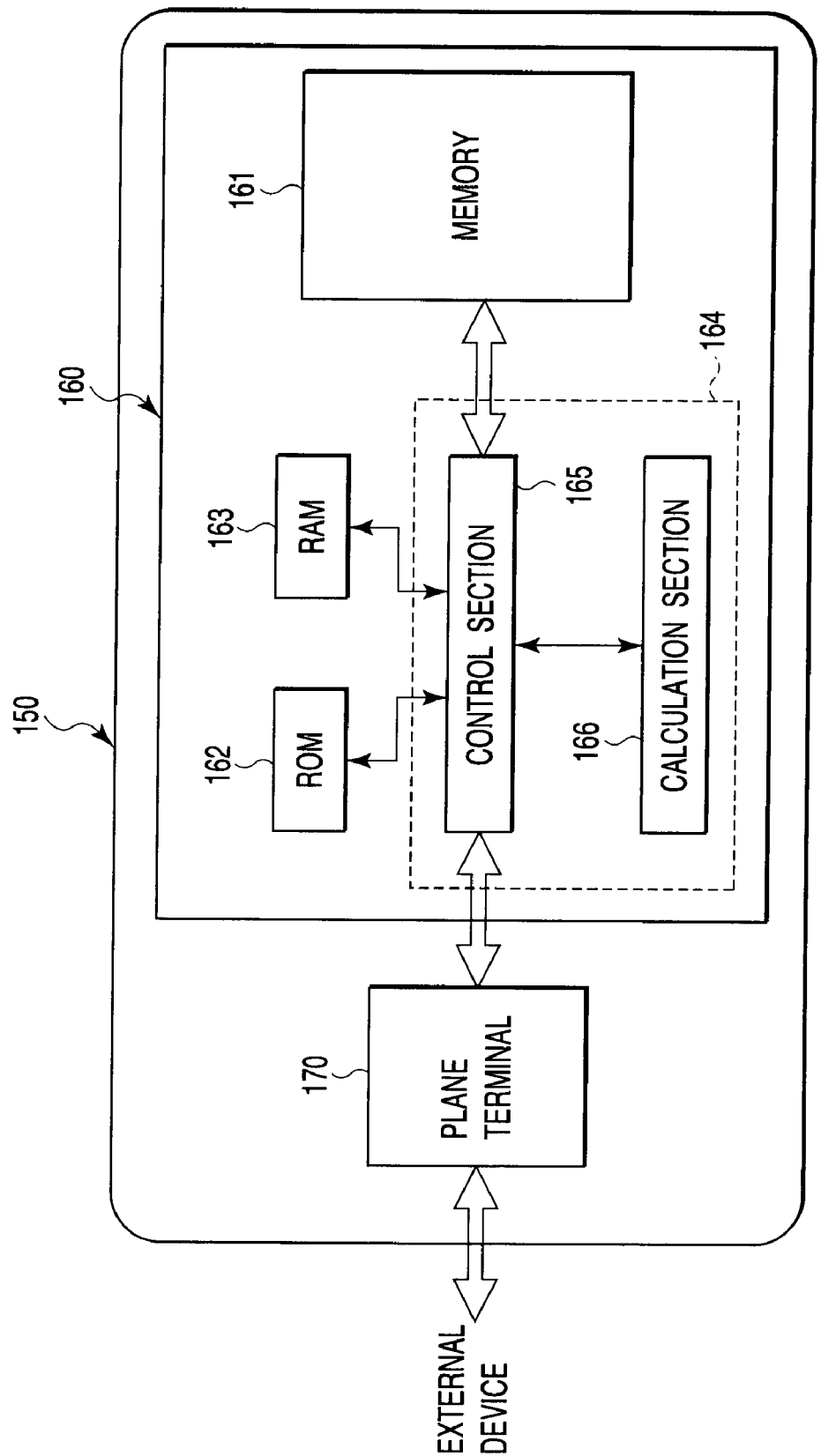
FIG. 23 is a block diagram showing the IC card provided with a flash memory according to any one of the first to fifth embodiments of the present invention.

The CPU 2 and flash memory 3 may be built in, e.g., an IC card. FIGS. 22 and 23 are an external view and a block diagram, respectively, showing an IC card. As shown in FIGS. 22 and 23, the IC card 150 includes an MCU 160 and a plane terminal 170. The MCU 160 includes a flash memory 161, and other circuits, such as a ROM 162, a RAM 163, and a CPU 164. The flash memory 161 and CPU 164 respectively correspond to the flash memory 3 and CPU 2 described with reference to the embodiments. The CPU 164 includes, e.g., a control section 165 and calculation section 166. The control section 165 is arranged to control connection between circuit blocks. The calculation section 166 is arranged to perform signal processing or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for controlling a semiconductor storage device including a plurality of memory cells each configured to hold data of 2 bits or more, the method comprising:

starting first signal processing and inputting lower bits of the data into the semiconductor storage device by a control unit, in response to the semiconductor storage device having been set in a ready state to receive the data;

starting second signal processing and inputting upper bits of the data into the semiconductor storage device by the control unit, in response to the semiconductor storage device having been changed into the ready state from a busy state to reject input of the data, at or by an end of writing the lower bits to the memory cells; and finishing the second signal processing by the control unit, at or by an end of writing the upper bits to the memory cells, a period necessary for said writing the upper bits being longer than a period necessary for said writing the lower bits, a period necessary for performing the second signal processing being longer than a period necessary for performing the first signal processing.

2. The method according to claim 1, wherein a data amount processed in the second signal processing is larger than a data amount processed in the first signal processing.

3. The method according to claim 1, wherein the semiconductor storage device outputs a ready/busy signal, which indicates whether the semiconductor storage device is in the ready state or in the busy state, to the control unit, and the control unit performs the first signal processing and the second signal processing in synchronism with the ready/busy signal.

4. The method according to claim 1, wherein:

when the control unit inputs the lower bits of the data, the lower bits are input to a first register circuit in the semiconductor memory device, after the lower bits in the first register circuit are transferred to a second register circuit in the semiconductor memory device, the first register circuit is emptied and the semiconductor memory device changes a state into the ready state from the busy state.

5. The method according to claim 1, wherein the semiconductor storage device is disposed in a memory card, and the control unit is disposed in a computer connectable to the memory card.

6. The method according to claim 1, wherein at least one of the first signal processing and the second signal processing is audio encoding processing, and the data to be written to the semiconductor storage device is encoded audio data obtained by the encoding processing.

7. A method for controlling a semiconductor storage device including a plurality of memory cells each configured to hold data of 2 bits or more, the method comprising:

starting first signal processing and inputting addresses of lower bits of the data into the semiconductor storage device by a control unit, in response to the semiconductor storage device having been set in the ready state to receive the addresses;

starting second signal processing and inputting addresses of upper bits of the data into the semiconductor storage device by the control unit, in response to the semiconductor storage device having been changed into the ready state from a busy state to reject input of the addresses, at or by an end of reading the lower bits of the data from the memory cells; and finishing the second signal processing by the control unit, at or by an end of reading the upper bits from the memory cells, a period necessary for said reading the upper bits being longer than a period necessary for said reading the lower bits, a period necessary for performing the second signal processing being longer than a period necessary for performing the first signal processing.

8. The method according to claim 7, wherein a data amount processed in the second signal processing is larger than a data amount processed in the first signal processing.

9. The method according to claim 7, wherein the semiconductor storage device outputs a ready/busy signal, which indicates whether the semiconductor storage device is in the ready state or in the busy state, to the control unit, and the control unit performs the first signal processing and the second signal processing in synchronism with the ready/busy signal.

10. The method according to claim 7, wherein the semiconductor storage device is disposed in a memory card, and the control unit is disposed in a computer connectable to the memory card.

11. A memory card comprising:

a semiconductor memory including a plurality of memory cells each configured to hold data of 2 bits or more, the semiconductor memory including an input/output buffer configured to receive write data in data writing and to receive addresses of memory cells in data reading, a memory cell array including the plurality of memory cells and arranged such that upper bits or lower bits of the 2-bit data are written or read all together in units of the plurality of memory cells, and a period necessary for writing the upper bits is longer than a period necessary for writing the lower bits, and a control circuit configured to control writing and reading of the data to and from the memory cell array, and to generate a ready/busy signal indicative whether or not the input/output buffer is in a state to receive the write data or the addresses; and a processor configured to output the write data and the addresses to the semiconductor memory, and to perform signal processing in synchronism with the ready/busy signal supplied from the control circuit, a period used for signal processing performed in synchronism with writing or reading the upper bits being longer than a period used for signal processing performed in synchronism with writing or reading the lower bits.

12. The card according to claim 11, wherein a data amount processed in the signal processing performed in synchronism with writing or reading the upper bits is larger than a data amount processed in the signal processing performed in synchronism with writing or reading the lower bits.

13. The card according to claim 11, wherein the semiconductor memory further includes a first register circuit configured to hold the write data supplied from the input/output buffer, and a second register circuit configured to receive the write data transferred from the first register circuit, and to write the write data thus transferred to memory cells, wherein the input/output buffer is set in a state to receive the write data, in response to the first register circuit having been emptied by transferring the write data from the first register circuit to the second register circuit.

14. The card according to claim 11, wherein the signal processing performed by the processor is audio encoding processing, and encoded audio data obtained by the encoding processing is written to the semiconductor memory.

* * * * *